United States Patent
Kim et al.

(10) Patent No.: US 9,318,185 B2
(45) Date of Patent: Apr. 19, 2016

(54) MEMORY MODULE AND MEMORY SYSTEM INCLUDING THE SAME

(71) Applicant: Samsung Electronics Co., Ltd., Suwon-si (KR)

(72) Inventors: Sua Kim, Seongnam-si (KR); Chul-Woo Park, Yongin-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/517,255

(22) Filed: Oct. 17, 2014

(65) Prior Publication Data

US 2015/0243345 A1    Aug. 27, 2015

(30) Foreign Application Priority Data

Feb. 25, 2014   (KR) .......................... 10-2014-0021653

(51) Int. Cl.
   *G11C 11/406* (2006.01)
   *G11C 11/408* (2006.01)
   *G11C 5/04* (2006.01)

(52) U.S. Cl.
   CPC ...... *G11C 11/4082* (2013.01); *G11C 11/40615* (2013.01); *G11C 11/40618* (2013.01); *G11C 11/40622* (2013.01); *G11C 5/04* (2013.01)

(58) Field of Classification Search
   CPC .................. G11C 11/40615; G11C 11/40618; G11C 11/40622; G11C 11/4082; G11C 5/04
   See application file for complete search history.

(56) References Cited

U.S. PATENT DOCUMENTS

| | | | |
|---|---|---|---|
| 6,542,959 B2 | 4/2003 | Tabo | |
| 6,819,618 B2 | 11/2004 | Kashiwazaki | |
| 6,967,885 B2 | 11/2005 | Barth, Jr. et al. | |
| 7,260,009 B2 | 8/2007 | Origasa | |
| 7,543,106 B2 | 6/2009 | Choi | |
| 7,734,866 B2 | 6/2010 | Tsern | |
| 7,953,921 B2 | 5/2011 | Walker et al. | |
| 8,027,216 B2 | 9/2011 | Fukuda et al. | |
| 2002/0191467 A1* | 12/2002 | Matsumoto | G11C 11/406 365/222 |
| 2004/0165465 A1* | 8/2004 | Kashiwazaki | G11C 11/406 365/222 |

(Continued)

FOREIGN PATENT DOCUMENTS

| | | |
|---|---|---|
| JP | 1999-053882 A | 2/1999 |
| JP | 2000-215661 A | 8/2000 |

(Continued)

*Primary Examiner* — Khamdan Alrobaie
(74) *Attorney, Agent, or Firm* — Muir Patent Law, PLLC

(57) ABSTRACT

A memory module may include m memory devices. Each of the m memory devices may be divided into n regions each region including a plurality of rows corresponding to row addresses, where m and n are integers equal to or greater than 2. An address detector included in each of the m memory devices, wherein for each of the address detectors, the address detector may be configured to count a number of accesses to a particular row address included in one region of each of the m memory devices during a predetermined time period, and be configured to output a detect signal when the number of the counted accesses reaches a reference value. Each of the max-count address generators may be configured to count a number of accesses for a set of row addresses different from the sets of row addresses for which the other max-count address generators count accesses.

20 Claims, 21 Drawing Sheets

(56) References Cited

U.S. PATENT DOCUMENTS

| | | | |
|---|---|---|---|
| 2007/0242546 A1* | 10/2007 | Koshikawa | G11C 11/406 365/222 |
| 2013/0227212 A1 | 8/2013 | Proebsting | |
| 2013/0279283 A1* | 10/2013 | Seo | G11C 11/40611 365/222 |
| 2014/0068171 A1* | 3/2014 | Lee | G06F 13/1636 711/106 |

FOREIGN PATENT DOCUMENTS

| | | |
|---|---|---|
| JP | 2001-043677 A | 2/2001 |
| JP | 2002-063787 A | 2/2002 |

\* cited by examiner

FIG. 5

MEMORY MODULE AND MEMORY SYSTEM INCLUDING THE SAME

CROSS-REFERENCE TO RELATED APPLICATION

This application claims priority under 35 USC §119 to Korean Patent Applications No. 10-2014-0021653, filed on Feb. 25, 2014 in the Korean Intellectual Property Office (KIPO), the contents of which are herein incorporated by reference in their entirety.

BACKGROUND

1. Technical Field

Example embodiments relate generally to a memory device and more particularly to a memory module and a memory system including the memory module.

2. Description of the Related Art

Semiconductor devices widely used in high-performance electronic systems have experienced improvements in both capacity and speed. A dynamic random access memory (DRAM) is a volatile memory which stores data corresponding to charge in capacitors. The charge stored in the capacitor may leak such that the data therein may be retained for only a limited time before degradation occurs to the point where the state of the data may be unreliable. Therefore, the refresh operation is typically required in the dynamic random access memory. In general, when a particular row address of the DRAM is frequently accessed during a predetermined time period, corresponding memory cells of the particular row address may be deteriorated and need to be refreshed.

SUMMARY

Some example embodiments provide a memory module capable of decreasing a complexity of a circuit determining a concentrated access address in the memory device.

Some example embodiments provide a memory system capable of decreasing the complexity of the circuit determining the concentrated access address in the memory device.

According to example embodiments, a memory module includes first through N-th memory devices and a buffer unit. Each of the first through N-th memory devices is divided into first through M-th regions. Each of the first to N-th memory devices includes a max-count address generator. For each of the max-count address generators, the max-count address generator is configured to count a number of accesses to a row address included in respective J-th regions of the first through N-th memory devices and is configured to output a max-count address information when the number of the counted accesses reaches a threshold value, where M and N are integers equal to or greater than 2, and J is a natural number equal to or less than M. The buffer unit is configured to receive the max-count address information from the first through N-th memory devices and outputs a target row address to refresh memory cells of the target row address of the first to N-th memory devices corresponding to the max-count address information. Each of the max-count address generators is configured to count a number of accesses for a set of row addresses different from the sets of row addresses for which the other max-count address generators count accesses.

The max-count address generator may include a counter circuit, a storage circuit and a comparing circuit. The counter circuit may be configured to count a number of accesses for each row address of the respective J-th regions included in the first through N-th memory devices. The storage circuit may be configured to store the number of the counted accesses. The comparing circuit may be configured to output the max-count address information by comparing the number of counted accesses to a threshold value.

In case the number of the counted accesses to a particular row address in one of the J-th regions is equal to or greater than the threshold value, the comparing circuit may provide the max-count address information for the buffer unit.

The threshold value may be determined based on a predetermined time interval. As the predetermined time interval is decreased, the threshold value may be decreased.

The storage circuit may be configured to store the number of accesses to row addresses included in the J-th regions.

Each of the counters may count a number of accesses to a particular row address corresponding to the J-th regions for each of the first through N-th memory devices.

The buffer unit may include a refresh signal generator. The refresh signal generator may be configured to provide the target row address to the first through N-th memory devices based on the max-count address information.

In case at least one max-count address generator of the max-count address generators included in the first through N-th memory devices outputs the max-count address information, the refresh signal generator may output the target row address corresponding to the max-count address information.

When the first through N-th memory devices receive the target row address, memory cells of an adjacent row address to the target row address may be refreshed.

When the first through N-th memory devices receive the target row address memory cells of the target row address and an adjacent row address to the target row address may be refreshed.

Each of the J-th regions is a bank included in a memory cell array of a respective one of the first through N-th memory devices.

According to example embodiments, a memory system includes a memory module and a memory controller. The memory controller is configured to provide an address and a command for the memory module. The memory module includes first through N-th memory devices and a buffer unit. Each of the first through N-th memory devices is divided into first through M-th regions. Each of the first to N-th memory devices includes a max-count address generator. For each of the max-count address generators, the max-count address generator is configured to count a number of accesses to a row address included in respective J-th regions of the first through N-th memory devices and is configured to output a max-count address information when the number of the counted accesses reaches a threshold value, where M and N are integers equal to or greater than 2, and J is a natural number equal to or less than M. The buffer unit is configured to receive the max-count address information from the first through N-th memory devices and outputs a target row address to refresh memory cells of the target row address of the first to N-th memory devices corresponding to the max-count address information. Each of the max-count address generators is configured to count a number of accesses for a set of row addresses different from the sets of row addresses for which the other max-count address generators count accesses The buffer unit may include a refresh signal generator and a wait signal generator. The refresh signal generator may provide the target row address and the active signal for the first through N-th memory devices based on the max-count address information. The wait signal generator may provide a wait signal for the memory controller in case the buffer unit simultaneously receives the command and the max-count address information.

In case the memory controller receives the wait signal, the memory controller may stop providing the command.

In case the memory controller receives the wait signal, the memory controller may retry the command after a predetermined time interval.

According to example embodiments, a memory module includes m memory devices, each of the m memory devices being divided into n regions each region including a plurality of rows corresponding to row addresses, where m and n are integers equal to or greater than 2. An address detector included in each of the m memory devices, wherein for each of the address detectors, the address detector is configured to count a number of accesses to a particular row address included in one region of each of the m memory devices during a predetermined time period, and is configured to output a detect signal when the number of the counted accesses reaches a reference value. Each of the max-count address generators is configured to count a number of accesses for a set of row addresses different from the sets of row addresses for which the other max-count address generators count accesses.

BRIEF DESCRIPTION OF THE DRAWINGS

Illustrative, non-limiting example embodiments will be more clearly understood from the following detailed description taken in conjunction with the accompanying drawings.

FIG. 5 is a diagram illustrating an example of the regions managed by a max-count address generator included in the memory module of FIG. 4 according to one embodiment.

DETAILED DESCRIPTION OF THE EMBODIMENTS

Figure 1:
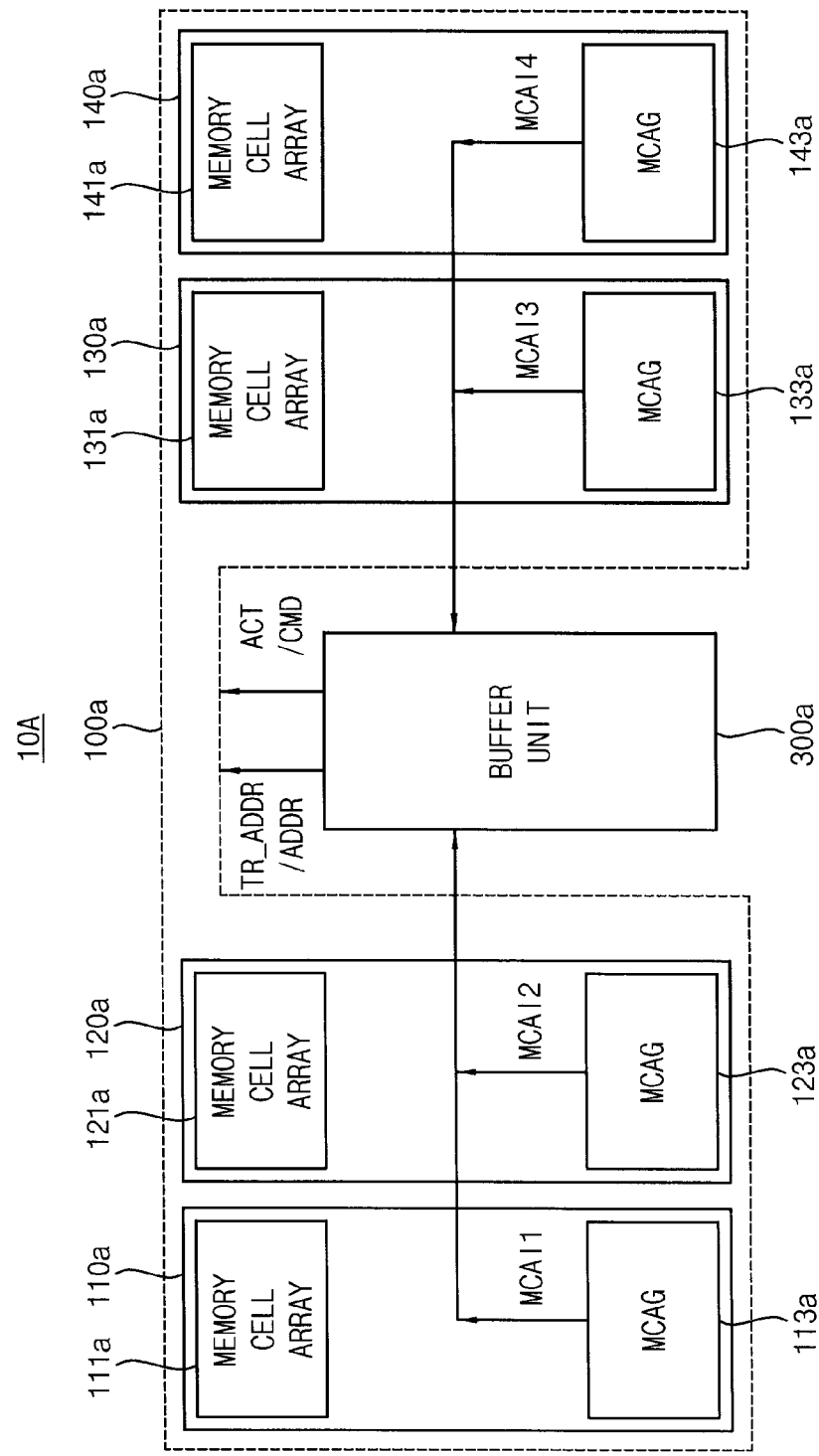
FIG. 1 is a block diagram illustrating a memory module according to example embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. Unless indicated otherwise, these elements are used to distinguish one element from another. For example, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms such as "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
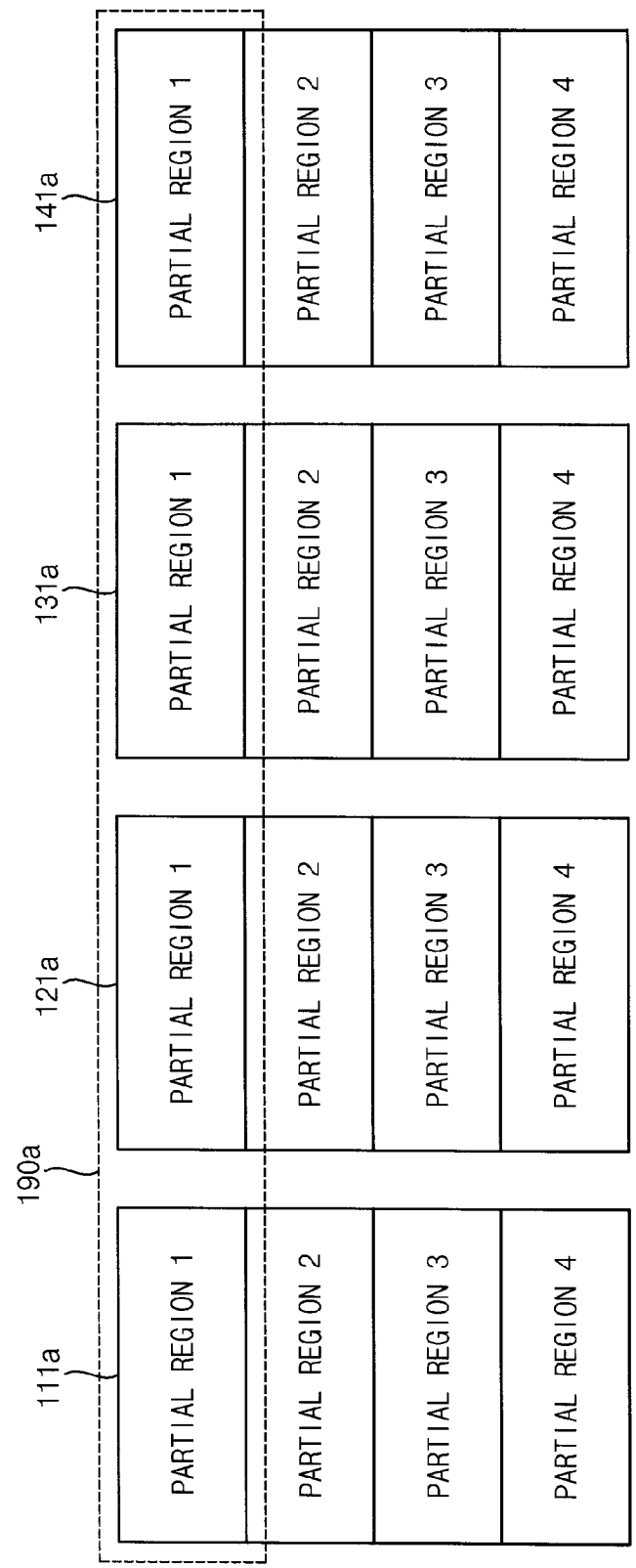
FIG. 2 is a diagram illustrating an example of regions managed by a max-count address generator included in the memory module of FIG. 1 according to one embodiment.
Figure 3:
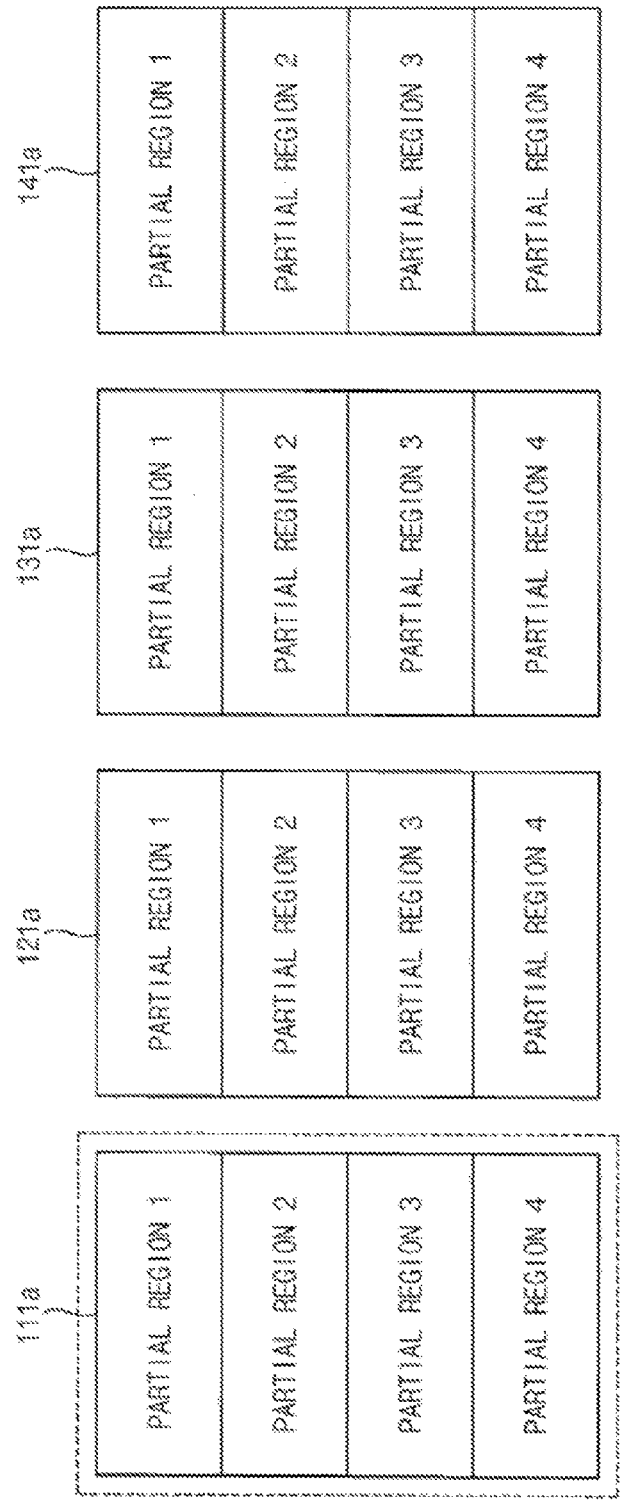
FIG. 3 is a diagram illustrating an example of regions managed by a conventional max-count address generator included in the memory module.

FIG. 1 is a block diagram illustrating a memory module according to example embodiments, FIG. 2 is a diagram illustrating an example of regions managed by a max-count address generator MCAG included in the memory module of FIG. 1 according to one embodiment and FIG. 3 is a diagram illustrating an example of regions managed by a conventional max-count address generator MCAG included in the memory module.

As used herein, a memory device may refer to various devices such as a memory chip or a memory package. A memory device may include a chip formed from a wafer. A memory device may include a package including one or more semiconductor chips stacked on a package substrate, or a package-on-package device including a plurality of packages.

An electronic device, as used herein, may include products that include these memory devices, such as a memory module, a hard drive including additional components, or a mobile phone, laptop, tablet, desktop, camera, or other consumer electronic device, etc.

Referring to FIGS. 1 and 2, a memory module 10A includes first through fourth memory devices 100a and a buffer unit 300a which may be a buffer circuit (a group of memory devices may be referred to as first through N-th memory devices herein). N is integer that is equal to or greater than two. Each of the first through fourth memory devices 100a may be divided into first through fourth regions (a group of regions may be referred to herein as a M-th regions). M is integer that is equal to or greater than two. For example, the memory module 10A may include a first memory device 110a, a second memory device 120a, a third memory device 130a and a fourth memory device 140a. Each of the first memory device 110a, the second memory device 120a, the third memory device 130a and the fourth memory device 140a may include a memory cell array. The memory cell array included in each of the first memory device 110a, the second memory device 120a, the third memory device 130a and the fourth memory device 140a may include a first region PARTIAL REGION 1, a second region PARTIAL REGION 2, a third region PARTIAL REGION 3 and a fourth region PARTIAL REGION 4.

Each of the first to fourth memory devices 100a may include a max-count address generator MCAG (or an address detector). For example, each of the first memory device 110a, the second memory device 120a, the third memory device 130a and the fourth memory device 140a may include the max-count address generator MCAG.

In one embodiment, a first max-count address generator 113a of the first memory device 110a may receive a row address corresponding to the first region PARTIAL REGION 1 of any of the first through fourth memory devices 100a. The max-count address generator 113a may output a first max-count address information MCAI 1 (or a first detect signal) when a number of accesses to the row address corresponding to the first region PARTIAL REGION 1 of each of the first through fourth memory devices 100a reaches a reference value during a predetermined time period. A second max-count address generator 123a of the second memory device 120a may receive a row address corresponding to the second region PARTIAL REGION 2 of any of the first through fourth memory devices 100a. The max-count address generator 123a may output a second max-count address information MCAI 2 when a number of accesses to the row address corresponding to the second region PARTIAL REGION 2 of each of the first through fourth memory devices 100a reaches the reference value during the predetermined time period. A third max-count address generator 133a of the third memory device 130a may receive a row address corresponding to the third region PARTIAL REGION 3 of any of the first through fourth memory devices 100a. The max-count address generator 133a may output a third max-count address information MCAI 3 when a number of accesses to the row address corresponding to the third region PARTIAL REGION 3 of each of the first through fourth memory devices 100a reaches the reference value during the predetermined time period. A fourth max-count address generator 143a of the fourth memory device 140a may receive a row address corresponding to the fourth region PARTIAL REGION 4 of any of the first through fourth memory devices 100a. The max-count address generator 143a may output a fourth max-count address information MCAI 4 when a number of accesses to the row address corresponding to the fourth region PARTIAL REGION 4 of each of the first through fourth memory devices 100a reaches the reference value during the predetermined time period.

The buffer unit 300a receives the max-count address information MCAI from the first through fourth memory devices 100a. For example, the first max-count address information MCAI 1 may be transferred from the first max-count address generator 113a included in the first memory device 110a to the buffer unit 300a. The second max-count address information MCAI 2 may be transferred from the second max-count address generator 123a included in the second memory device 120a to the buffer unit 300a. The third max-count address information MCAI 3 may be transferred from the third max-count address generator 133a included in the third memory device 130a to the buffer unit 300a. The fourth max-count address information MCAI 4 may be transferred from the fourth max-count address generator 143a included in the fourth memory device 140a to the buffer unit 300a.

In one embodiment, the buffer unit 300a may output an active signal ACT and a target row address TR_ADDR to refresh the target row address TR_ADDR of the first to fourth memory devices 100a corresponding to the max-count address information MCAI. For example, the active signal ACT may include a precharge command signal so that memory cells of the target row address TR_ADDR are refreshed in response to the max-count address information MCAI.

In another embodiment, the buffer unit 300a may output a refresh command signal and the target row address TR_ADDR to refresh memory cells of the target row address TR_ADDR of the first to fourth memory devices 100a in response to the max-count address information MCAI.

For example, in one embodiment, the max-count address generator MCAG included in each memory device (a particular memory device may be referred to herein as a K-th memory device) of the first through fourth memory devices 100a outputs a max-count address information MCAI based on a row address access number RAAN. The row address access number RAAN may be a number of accesses to a row address included in one region of each of the first to fourth memory devices 100a (a particular region may be referred to herein as a J-th region). K is a natural number that is equal to or less than N and J is a natural number that is equal to or less than M. Certain embodiments are described herein with reference to specific values for J, K, M, or N. However, the invention is not limited to these specific values.

For example, the max-count address generator MCAG included in each memory device of the first through fourth memory devices 100a may count the row address access number RAAN of row addresses included in the first region PARTIAL REGION 1 of the first memory cell array 111a, the first region PARTIAL REGION 1 of the second memory cell array 121a, the first region PARTIAL REGION 1 of the third memory cell array 131a and the first region PARTIAL REGION 1 of the fourth memory cell array 141a. The max-count address generator MCAG included in one memory device of the first through fourth memory devices 100a may output the max-count address information MCAI based on the row address access number RAAN. The max-count address generator MCAG is included in each of the plurality of the memory devices 100a in FIG. 1. However, the max-count address generator MCAG may be placed outside of the plurality of the memory devices 100a.

For example, row addresses of the first region PARTIAL REGION 1 included in the first memory cell array 111a may be 0x00000~0x00111. Row addresses of the first region PARTIAL REGION 1 included in the second memory cell array 121a may be 0x00000~0x00111. Row addresses of the first region PARTIAL REGION 1 included in the third memory cell array 131a may be 0x00000~0x00111. Row addresses of the first region PARTIAL REGION 1 included in the fourth memory cell array 141a may be 0x00000~0x00111. The row addresses included in the first region PARTIAL REGION 1 of the plurality of the memory devices 100a that the max-count address generator MCAG included in the K-th memory device manages may be the same as 0x00000~0x00111.

The max-count address generator MCAG according to example embodiments may decrease the complexity of the logic circuit included in the max-count address generator MCAG because the max-count address generator MCAG manages the row addresses of the same region included in each of the plurality of the memory devices 100a.

Referring to FIG. 3, a conventional max-count address generator MCAG may count the row address access number RAAN of row addresses included in the first region PARTIAL REGION 1 of the first memory cell array 111a, the second region PARTIAL REGION 2 of the first memory cell array 111a, the third region PARTIAL REGION 3 of the first memory cell array 111a and the fourth region PARTIAL REGION 4 of the first memory cell array 111a. The conventional max-count address generator MCAG may output the max-count address information MCAI based on the row address access number RAAN.

For example, row addresses of the first region PARTIAL REGION 1 included in the first memory cell array 111a may be 0x00000~0x00111. Row addresses of the second region PARTIAL REGION 2 included in the first memory cell array 111a may be 0x01000~0x01111. Row addresses of the third region PARTIAL REGION 3 included in the first memory cell array 111a may be 0x10000~0x10111. Row addresses of the fourth region PARTIAL REGION 4 included in the first memory cell array 111a may be 0x11000~0x11111. The row addresses included in the first region PARTIAL REGION 1, the second region PARTIAL REGION 2, the third region PARTIAL REGION 3 and the fourth region PARTIAL REGION 4 of the first memory cell array 111a that the conventional max-count address generator MCAG manages may be the same as 0x00000~0x11111.

For example, in case the row address access number RAAN is counted by a row address included in the plurality of the memory devices, the complexity of the max-count address generator MCAG according to example embodiments may be ¼ of the complexity of the conventional max-count address generator MCAG.

Figure 4:
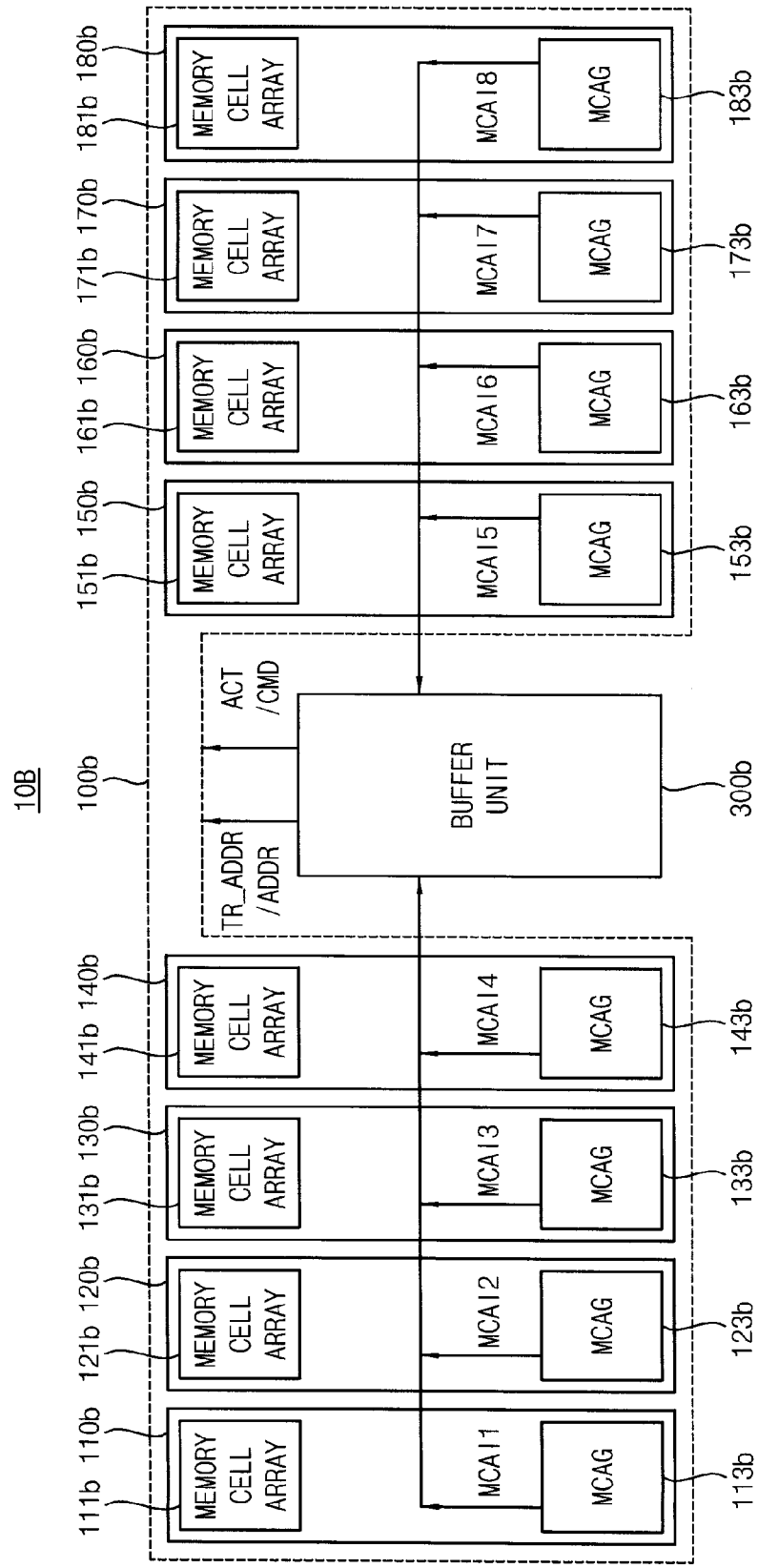
FIG. 4 is a block diagram illustrating a memory module according to example embodiments.
Figure 5:
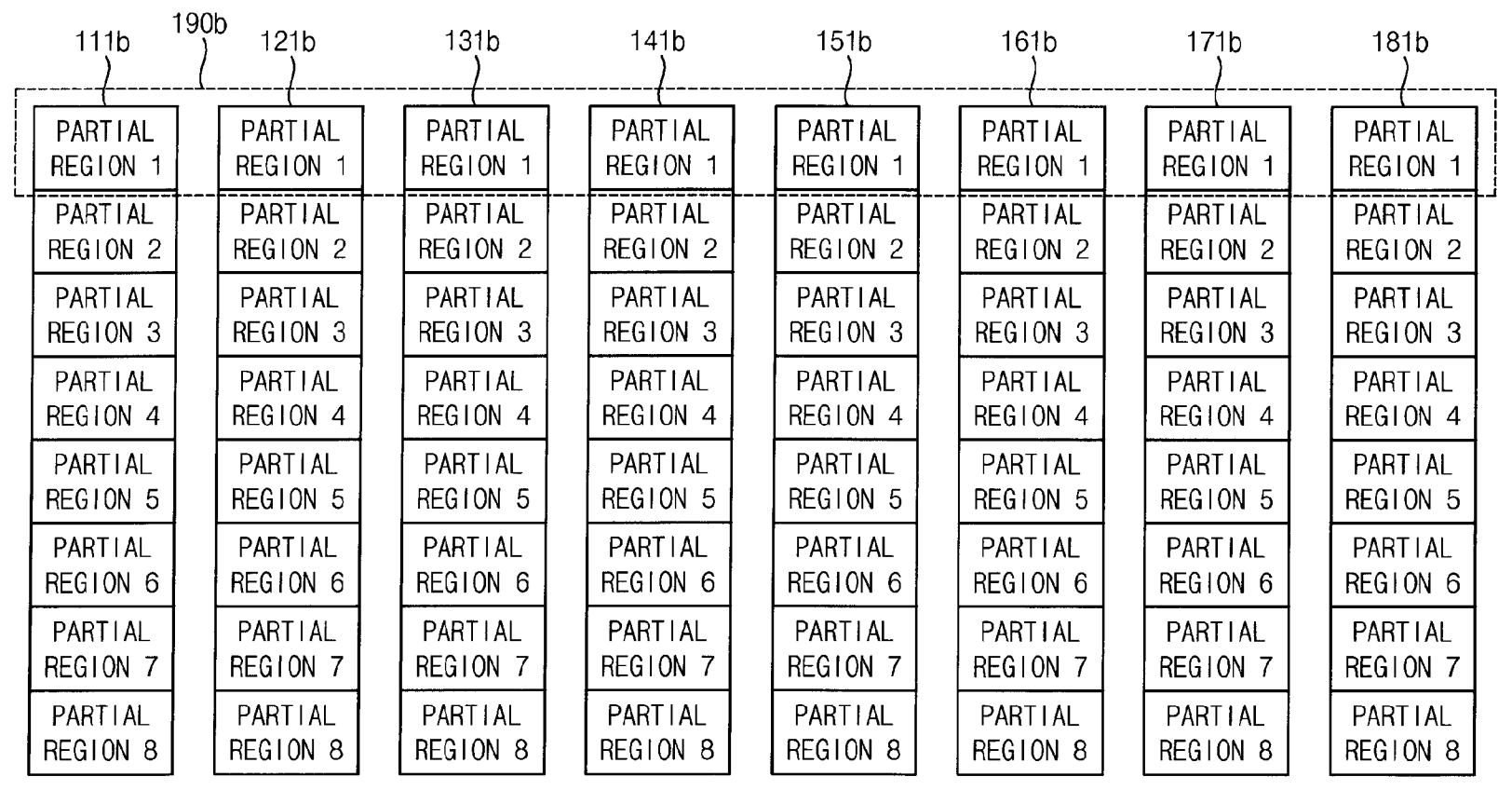
Figure 6:
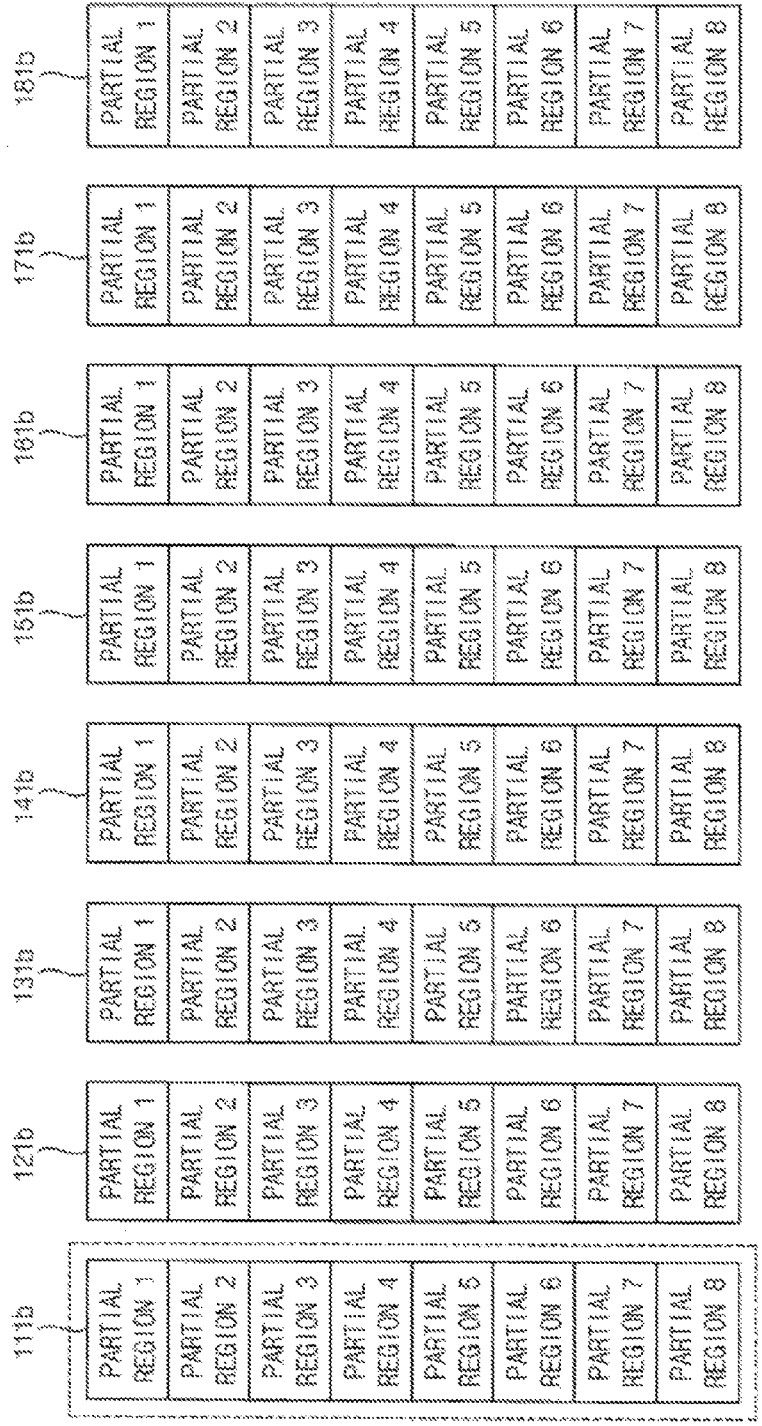
FIG. 6 is a diagram illustrating another example of the regions managed by the conventional max-count address generator included in the memory module.

FIG. 4 is a block diagram illustrating a memory module according to example embodiments, FIG. 5 is a diagram illustrating an example of the regions managed by a max-count address generator included in the memory module of FIG. 4 according to one embodiment and FIG. 6 is a diagram illustrating another example of the regions managed by the conventional max-count address generator included in the memory module.

Referring to FIGS. 4 and 5, For example, a memory module 10B may include first through eighth memory devices 100b and a buffer unit 300b. Each of the first through eighth memory devices 100b may include a memory cell array. The memory cell array included in each of the first through eighth memory devices 100b may include first through eighth regions. Each of the first to eighth memory devices 100b may include a max-count address generator MCAG. For example, each of the first through eighth memory devices 100b may include the max-count address generator MCAG.

In one embodiment, the buffer unit 300b may output an active signal ACT and a target row address TR_ADDR to refresh the target row address TR_ADDR of each of the first to eighth memory devices 100b corresponding to the max-count address information MCAI. For example, the active signal ACT may include a precharge command signal so that memory cells of the target row address TR_ADDR are refreshed in response to the max-count address information MCAI.

In another embodiment, the buffer unit 300b may output a refresh command signal and the target row address TR_ADDR to refresh memory cells of the target row address TR_ADDR of the first to eighth memory devices 100b in response to the max-count address information MCAI.

For example, the max-count address generator MCAG included in each memory device of the first through eighth memory devices 100b outputs a max-count address information MCAI based on a row address access number RAAN. The row address access number RAAN may be a number of accesses to a row address included in one region of each of the first to eighth memory devices 100b.

For example, the max-count address generator MCAG included in each memory device of the first through eighth memory devices 100b may count the row address access number RAAN of row addresses included in the first region PARTIAL REGION 1 of the first memory cell array 111b, the first region PARTIAL REGION 1 of the second memory cell array 121b, the first region PARTIAL REGION 1 of the third memory cell array 131b, the first region PARTIAL REGION 1 of the fourth memory cell array 141b, the first region PARTIAL REGION 1 of the fifth memory cell array 151b, the first region PARTIAL REGION 1 of the sixth memory cell array 161b, the first region PARTIAL REGION 1 of the seventh memory cell array 171b and the first region PARTIAL REGION 1 of the eighth memory cell array 181b. The max-count address generator MCAG included in each memory device of the first through eighth memory devices 100b may output the max-count address information MCAI based on the row address access number RAAN. The max-count address generator MCAG included in each of the memory devices 100b may output the max-count address information MCAI according to the row address access number RAAN.

For example, row addresses of the first region PARTIAL REGION 1 included in the first memory cell array 111b may be 0x00000~0x00111. Row addresses of the first region PARTIAL REGION 1 included in the second memory cell array 121b may be 0x00000~0x00111. Row addresses of the first region PARTIAL REGION 1 included in the third memory cell array 131b may be 0x00000~0x00111. Row addresses of the first region PARTIAL REGION 1 included in the fourth memory cell array 141b may be 0x00000~0x00111. Row addresses of the first region PARTIAL REGION 1 included in the fifth memory cell array 151b may be 0x00000~0x00111. Row addresses of the first region PARTIAL REGION 1 included in the sixth memory cell array 161b may be 0x00000~0x00111. Row addresses of the first region PARTIAL REGION 1 included in the seventh memory cell array 171b may be 0x00000~0x00111. Row addresses of the first region PARTIAL REGION 1 included in the eighth memory cell array 181b may be 0x00000~0x00111. The row addresses included in the first region PARTIAL REGION 1 of the plurality of the memory devices 100b that the max-count address generator MCAG included in the K-th memory device manages may be the same as 0x00000~0x00111.

The max-count address generator MCAG according to example embodiments may decrease the complexity of the logic circuit included in the max-count address generator MCAG because the max-count address generator MCAG manages the row addresses of the same region included in each of the plurality of the memory devices 100b.

Referring to FIG. 6, a conventional max-count address generator MCAG may count the row address access number RAAN of row addresses included in the first region PARTIAL REGION 1 of the first memory cell array 111b, the second region PARTIAL REGION 2 of the first memory cell array 111b, the third region PARTIAL REGION 3 of the first memory cell array 111b, the fourth region PARTIAL REGION 4 of the first memory cell array 111b, the fifth region of the first memory cell array 111b, the sixth region of the first memory cell array 111b, the seventh region of the first memory cell array 111b, the eighth region of the first memory cell array 111b. The conventional max-count address generator MCAG may output the max-count address information MCAI based on the row address access number RAAN.

For example, row addresses of the first region PARTIAL REGION 1 included in the first memory cell array 111b may be 0x000000~0x000111. Row addresses of the second region PARTIAL REGION 2 included in the first memory cell array 111b may be 0x001000~0x001111. Row addresses of the third region PARTIAL REGION 3 included in the first memory cell array 111b may be 0x010000~0x010111. Row addresses of the fourth region PARTIAL REGION 4 included in the first memory cell array 111b may be 0x011000~0x011111. Row addresses of the fifth region included in the first memory cell array 111b may be 0x100000~0x100111. Row addresses of the sixth region included in the first memory cell array 111b may be 0x101000~0x101111. Row addresses of the seventh region included in the first memory cell array 111b may be 0x110000~0x110111. Row addresses of the eighth region included in the first memory cell array 111b may be 0x111000~0x111111. The row addresses included in the first region PARTIAL REGION 1, the second region PARTIAL REGION 2, the third region PARTIAL REGION 3, the fourth region PARTIAL REGION 4, the fifth region, the sixth region, the seventh region and the eighth region of the first memory cell array 111b that the conventional max-count address generator MCAG manages may be the same as 0x000000~0x111111.

For example, in case the row address access number RAAN is counted by a row address included in the plurality of the memory devices, the complexity of the max-count address generator MCAG according to example embodiments may be ⅛ of the complexity of the conventional max-count address generator MCAG.

Figure 7:
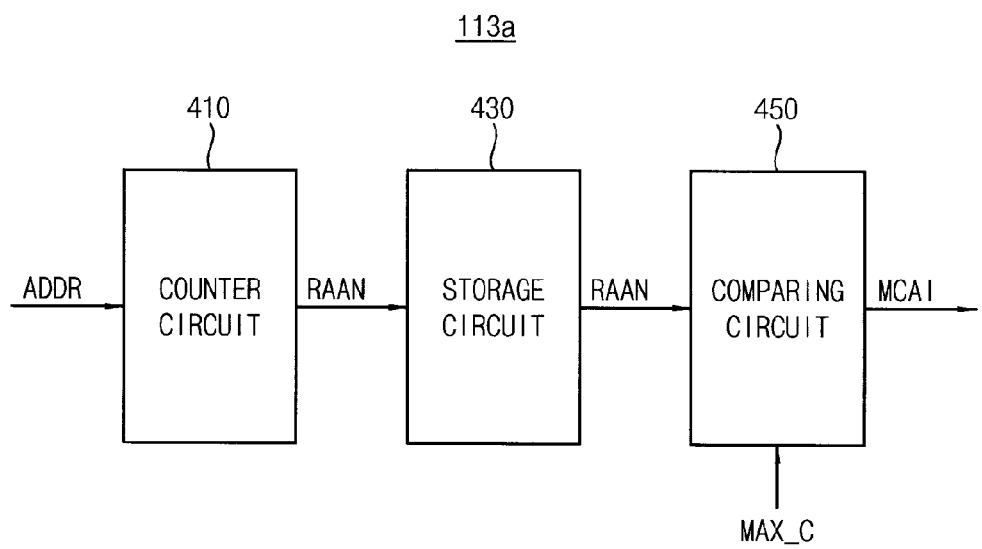
FIG. 7 is a block diagram illustrating the max-count address generator included in the memory module of FIG. 1 according to an example embodiment.

FIG. 7 is a block diagram illustrating the max-count address generator MCAG included in the memory module of FIG. 1 according to an example embodiment.

Referring to FIGS. 1 and 7, the max-count address generator MCAG may include a counter circuit 410, a storage circuit 430 and a comparing circuit 450. The counter circuit 410 may count the row address access number RAAN of the particular region of each of a plurality of memory devices 100a corresponding to an access address ADDR among memory cell arrays included in the first through fourth memory devices 100a. For example, in case the access address ADDR is a first row address included in the first region PARTIAL REGION 1 of the first memory cell array 111a, the row address access number RAAN corresponding to the first row address included in the first region PARTIAL REGION 1 of the first memory device 110a may be increased by 1.

The storage circuit 430 may store the row address access number RAAN. The comparing circuit 450 may output the max-count address information MCAI by comparing the row address access number RAAN to a threshold value MAX_C (e.g., a reference value).

In an example embodiment, when the row address access number RAAN of a particular region is equal to or greater than the threshold value MAX_C, the comparing circuit 450 may output the max-count address information MCAI to the buffer unit 300a. For example, in case the row address access number RAAN is 5 and the threshold value MAX_C is 10, the comparing circuit 450 may not output the max-count address information MCAI. In case the row address access number RAAN is 10 and the threshold value MAX_C is 10, the comparing circuit 450 may output the max-count address information MCAI.

In one embodiment, when the buffer unit 300a receives the max-count address information MCAI from the first through fourth memory devices 100a the buffer unit 300a may output the active signal ACT and the target row address TR_ADDR to refresh memory cells of a row address corresponding to the target row address TR_ADDR of the first to fourth memory devices 100a corresponding to the max-count address information MCAI.

Figure 8:
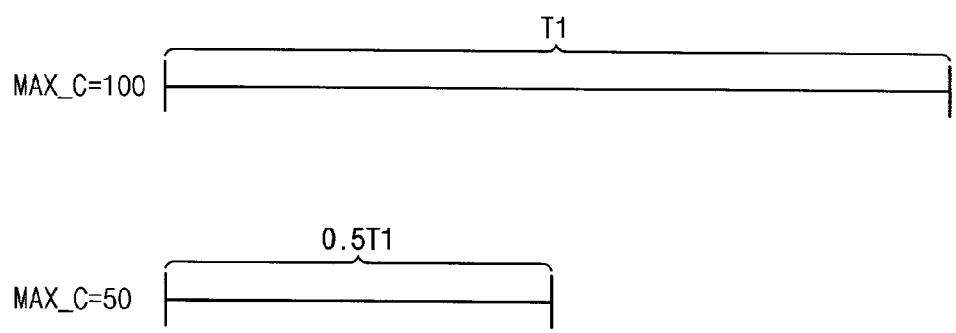
FIG. 8 is a diagram for describing example threshold values of a comparing circuit included in the max-count address generator of FIG. 7 according to one embodiment.

FIG. 8 is a diagram for describing example threshold values of a comparing circuit included in the max-count address generator of FIG. 7 according to one embodiment.

Referring to FIG. 8, the threshold value MAX_C may be determined based on a predetermined time interval. As the predetermined time interval is decreased, the threshold value MAX_C may be decreased. The predetermined time interval may be a refresh time cycle. For example, if the predetermined time interval is a time interval 1 (T1), the threshold value MAX_C may be 100. If the row address access number RAAN is greater than 100 for the time interval 1 (T1), the comparing circuit 450 may output the max-count address information MCAI. The time interval 1 (T1) is a twice time interval of a time interval 2 (0.5T1). If the predetermined time interval is the time interval 2 (0.5T1), the threshold value MAX_C may be 50. If the row address access number RAAN is greater than 50 for the time interval 2 (0.5T1), the comparing circuit 450 may output the max-count address information MCAI.

Figure 9:
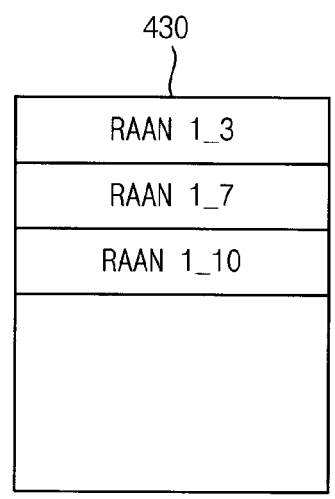
FIG. 9 is a diagram illustrating an example of a storage circuit included in the max-count address generator of FIG. 7 according to one embodiment.

FIG. 9 is a diagram illustrating an example of a storage circuit included in the max-count address generator of FIG. 7 according to one embodiment.

Referring to FIG. 9, the storage circuit 430 may store the row address access number RAAN for a part of row addresses included in particular regions. It is not efficient that the row address access number RAAN for all of row addresses included in the particular regions is stored in the storage circuit 430. For example, if the row address access number RAAN for the part of the row addresses which has a high access rate is stored in the storage circuit 430, the storage circuit 430 may be used more efficiently. For example, in case the row address access number RAAN 1_3 corresponding to a third row address included in the first region PARTIAL REGION 1 of the first memory cell array 111a has the high access rate, the row address access number RAAN 1_3 corresponding to the third row address included in the first region PARTIAL REGION 1 of the first memory cell array 111a may be stored in the storage circuit 430. In case the row address access number RAAN 1_2 corresponding to a second row address included in the first region PARTIAL REGION 1 of the first memory cell array 111a has the low access rate, the row address access number RAAN 1_2 corresponding to the second row address included in the first region PARTIAL REGION 1 of the first memory cell array 111a may not be stored in the storage circuit 430. In case the row address access number RAAN 1_7 corresponding to a seventh row address included in the first region PARTIAL REGION 1 of the first memory cell array 111a has the high access rate, the row address access number RAAN 1_7 corresponding to the seventh row address included in the first region PARTIAL REGION 1 of the first memory cell array 111a may be stored in the storage unit 430.

Figure 10:
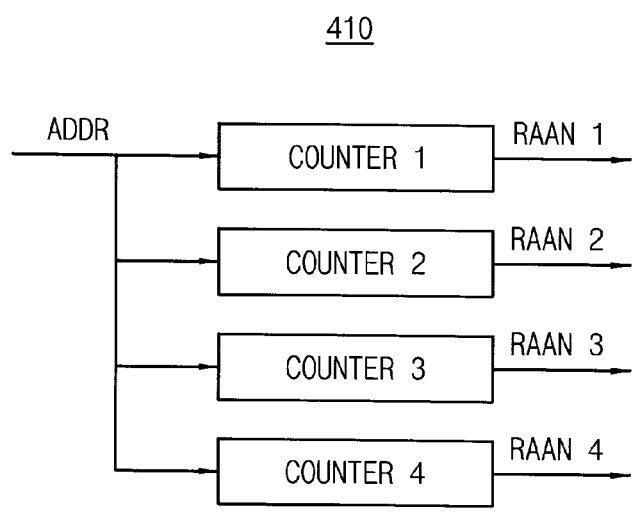
FIG. 10 is a block diagram illustrating an example of a counter circuit included in the max-count address generator of FIG. 7 according to one embodiment.
Figure 11:
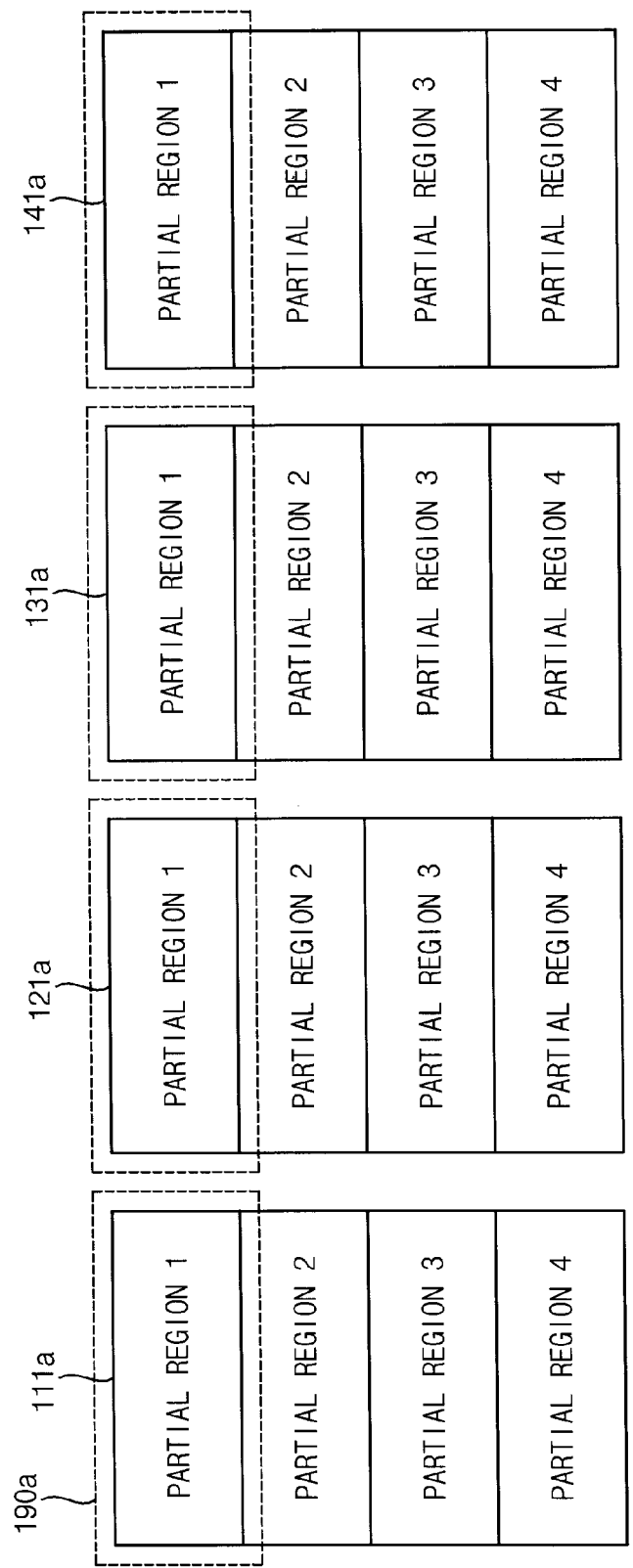
FIG. 11 is a diagram for describing the counter circuit of FIG. 10 according to an example embodiment.

FIG. 10 is a block diagram illustrating an example of a counter circuit included in the max-count address generator of FIG. 7 according to one embodiment and FIG. 11 is a diagram for describing the counter circuit of FIG. 10 according to an example embodiment.

Referring to FIGS. 10 and 11, the counter circuit 410 may include a first counter COUNTER 1, a second counter COUNTER 2, a third counter COUNTER 3 and a fourth counter COUNTER 4. In an example embodiment, the counter circuit 410 may include a plurality of counters. Each of the counters may count the row address access number RAAN corresponding to a particular region included in each of the first through fourth memory devices 100a.

For example, the first counter COUNTER 1 may count the row address access number RAAN 1 corresponding to the first region PARTIAL REGION 1 included in the first memory cell array 111a. The row address access number RAAN 1 may correspond to a number of accesses to each row address included in the first region PARTIAL REGION 1 of the first memory cell array 111a. The second counter COUNTER 2 may count the row address access number RAAN 2 corresponding to the first region PARTIAL REGION 1 included in the second memory cell array 121a. The row address access number RAAN 2 may correspond to a number of accesses to each row address included in the second region PARTIAL REGION 2 of the first memory cell array 111a. The third counter COUNTER 3 may count the row address access number RAAN 3 corresponding to the first region PARTIAL REGION 1 included in the third memory cell array 131a. The row address access number RAAN 3 may correspond to a number of accesses to each row address included in the third region PARTIAL REGION 3 of the first memory cell array 111a. The fourth counter COUNTER 4 may count the row address access number RAAN 4 corresponding to the first region PARTIAL REGION 1 included in the fourth memory cell array 141a. The row address access number RAAN 4 may correspond to a number of accesses to each row address included in the fourth region PARTIAL REGION 4 of the first memory cell array 111a. In case the row address access number RAAN that is counted in each of the first through fourth counters is equal to or greater than the threshold value MAX_C, the comparing circuit 450 may output the max-count address information MCAI.

In one embodiment, when the buffer unit 300a receives the max-count address information MCAI from the first through fourth memory devices 100a, the buffer unit 300a may output the active signal ACT and the target row address TR_ADDR to refresh memory cells of a row address corresponding to the target row address TR_ADDR of the first to fourth memory devices 100a corresponding to the max-count address information MCAI.

Figure 12:
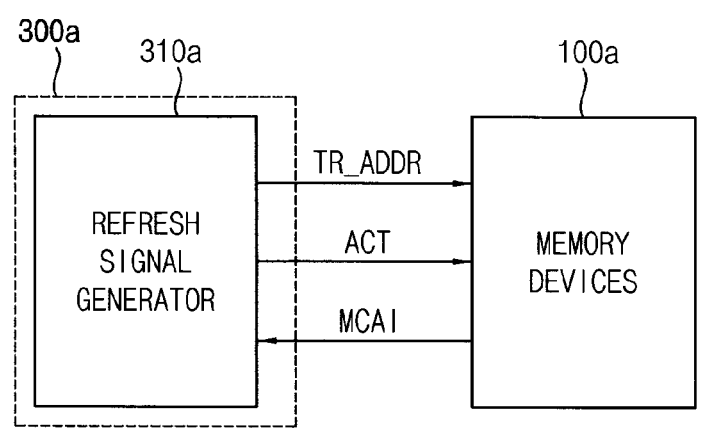
FIG. 12 is a diagram for describing an example of a buffer unit included in the memory module of FIG. 1 according to one embodiment.

FIG. 12 is a diagram for describing an example of a buffer unit included in the memory module of FIG. 1 according to one embodiment.

Referring to FIG. 12, the buffer unit 300a may include a refresh signal generator 310a. When the row address access number RAAN is equal to or greater than the threshold value MAX_C, the memory device may output the max-count address information MCAI.

The refresh signal generator 310a may provide the target row address TR_ADDR and the active signal ACT to the first through fourth memory devices 100a based on the max-count address information MCAI. The target row address TR_ADDR may be a row address corresponding to the max-count address information MCAI.

Figure 13:
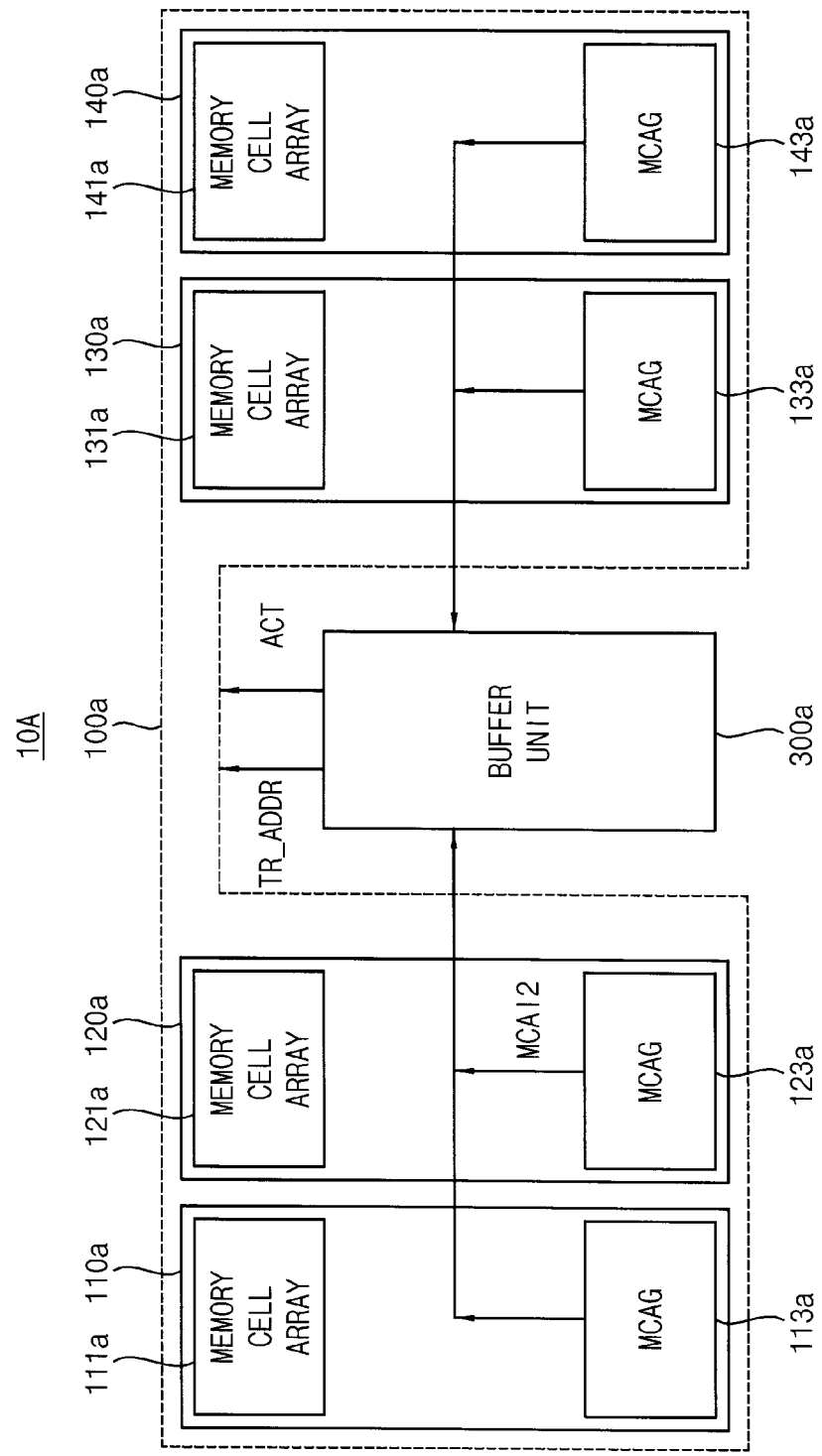
FIG. 13 is a block diagram illustrating a memory module according to example embodiments.
Figure 14:
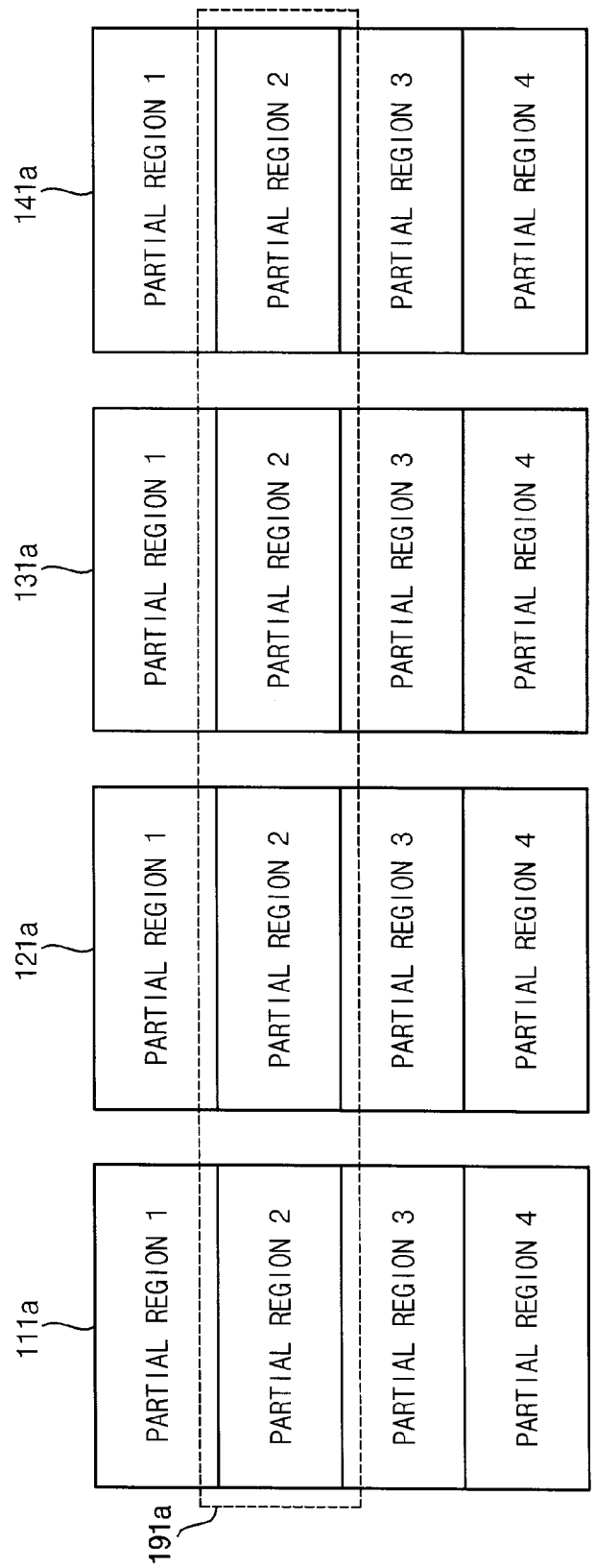
FIG. 14 is a diagram for describing an operation of the memory module of FIG. 13 according to an example embodiment.

FIG. 13 is a block diagram illustrating a memory module according to example embodiments and FIG. 14 is a diagram for describing an operation of the memory module of FIG. 13 according to an example embodiment.

Referring to FIGS. 13 and 14, a memory module 10A includes first through fourth memory devices 100a and a buffer unit 300a. Each of the first through fourth memory devices 100a may be divided into first through fourth regions. For example, the memory module 10A may include a first memory device 110a, a second memory device 120a, a third memory device 130a and a fourth memory device 140a. Each of the first memory device 110a, the second memory device 120a, the third memory device 130a and the fourth memory device 140a may include a memory cell array. The memory cell array included in each of the first memory device 110a, the second memory device 120a, the third memory device 130a and the fourth memory device 140a may include a first region PARTIAL REGION 1, a second region PARTIAL REGION 2, a third region PARTIAL REGION 3 and a fourth region PARTIAL REGION 4.

Each of the first to fourth memory devices 100a may include a max-count address generator MCAG. For example, each of the first memory device 110a, the second memory device 120a, the third memory device 130a and the fourth memory device 140a may include the max-count address generator MCAG.

The buffer unit 300a receives the max-count address information MCAI from the first through fourth memory devices 100a. For example, the first max-count address information MCAI 1 may be transferred from a first max-count address generator 113a included in the first memory device 110a to the buffer unit 300a. The second max-count address information MCAI 2 may be transferred from a second max-count address generator 123a included in the second memory device 120a to the buffer unit 300a. The third max-count address information MCAI 3 may be transferred from a third max-count address generator 133a included in the third memory device 130a to the buffer unit 300a. The fourth max-count address information MCAI 4 may be transferred from a fourth max-count address generator 143a included in the fourth memory device 140a to the buffer unit 300a.

In an example embodiment, in case at least one max-count address generator MCAG of the max-count address generators MCAG included in the first through fourth memory devices 100a outputs the max-count address information MCAI, the refresh signal generator 310a may output the target row address TR_ADDR and the active signal ACT corresponding to the max-count address information MCAI.

The buffer unit 300a may output an active signal ACT and a target row address TR_ADDR to refresh memory cells of a row address corresponding to the target row address TR_ADDR of the first to fourth memory devices 100a corresponding to the max-count address information MCAI.

For example, a second max-count address generator 123a included in a second memory device 120a of the first through fourth memory devices 100a outputs a second max-count address information MCAI 2 based on a row address access number RAAN. The row address access number RAAN may be a number of accesses to a row address included in a second region PARTIAL REGION 2 of each of the first to fourth memory devices 100a. For example, the max-count address generator MCAG included in the second memory device 120a may count the row address access number RAAN of row addresses included in the second region PARTIAL REGION 2 of the first memory cell array 111a, the second region PARTIAL REGION 2 of the second memory cell array 121a, the second region PARTIAL REGION 2 of the third memory cell array 131a and the second region PARTIAL REGION 2 of the fourth memory cell array 141a. The second max-count address generator 123a included in the second memory device 120a may output the second max-count address information MCAI 2 based on the row address access number RAAN.

Figure 15:
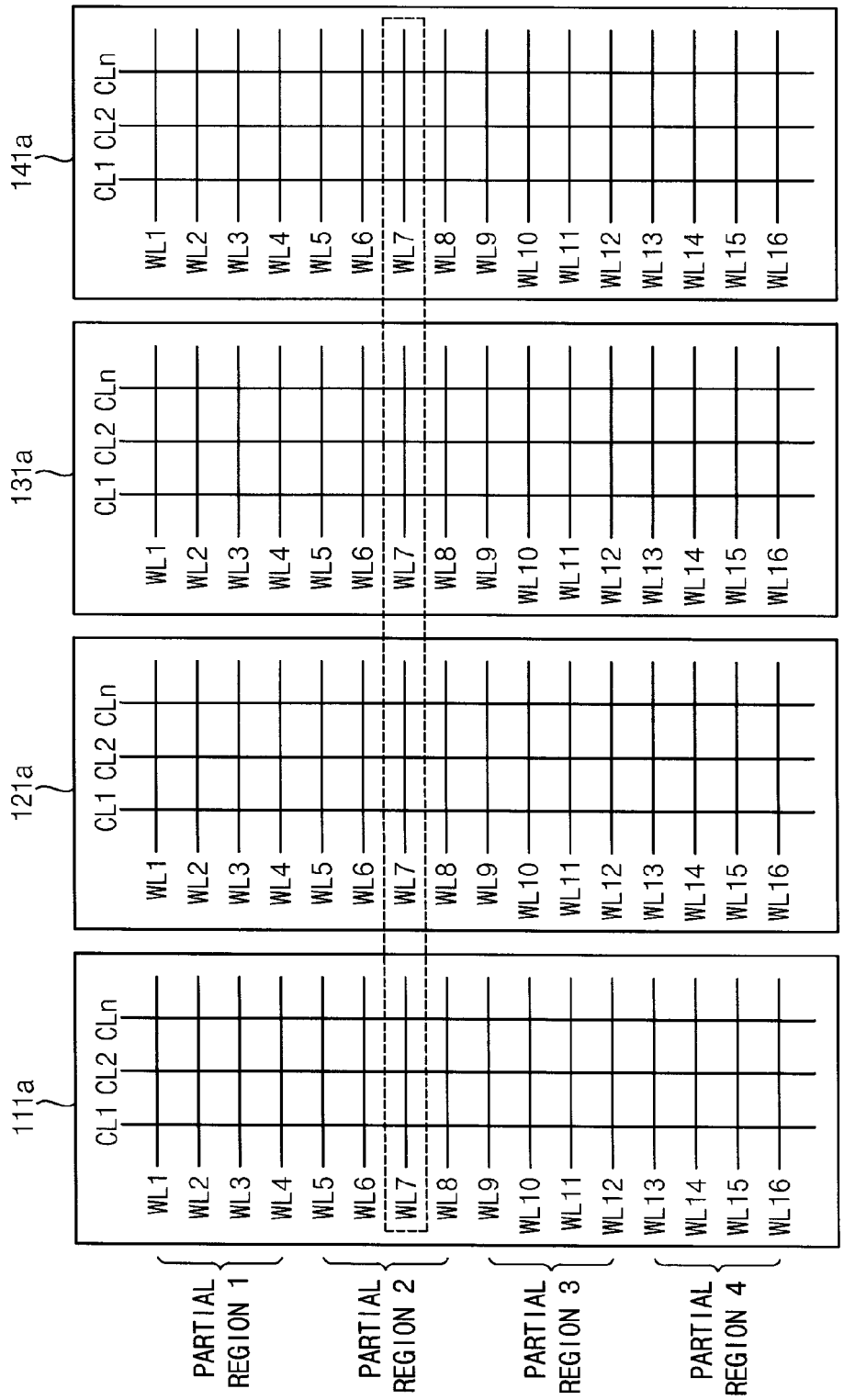
FIG. 15 is a diagram illustrating an example where memory devices included in the memory module of FIG. 1 are refreshed.
Figure 16:
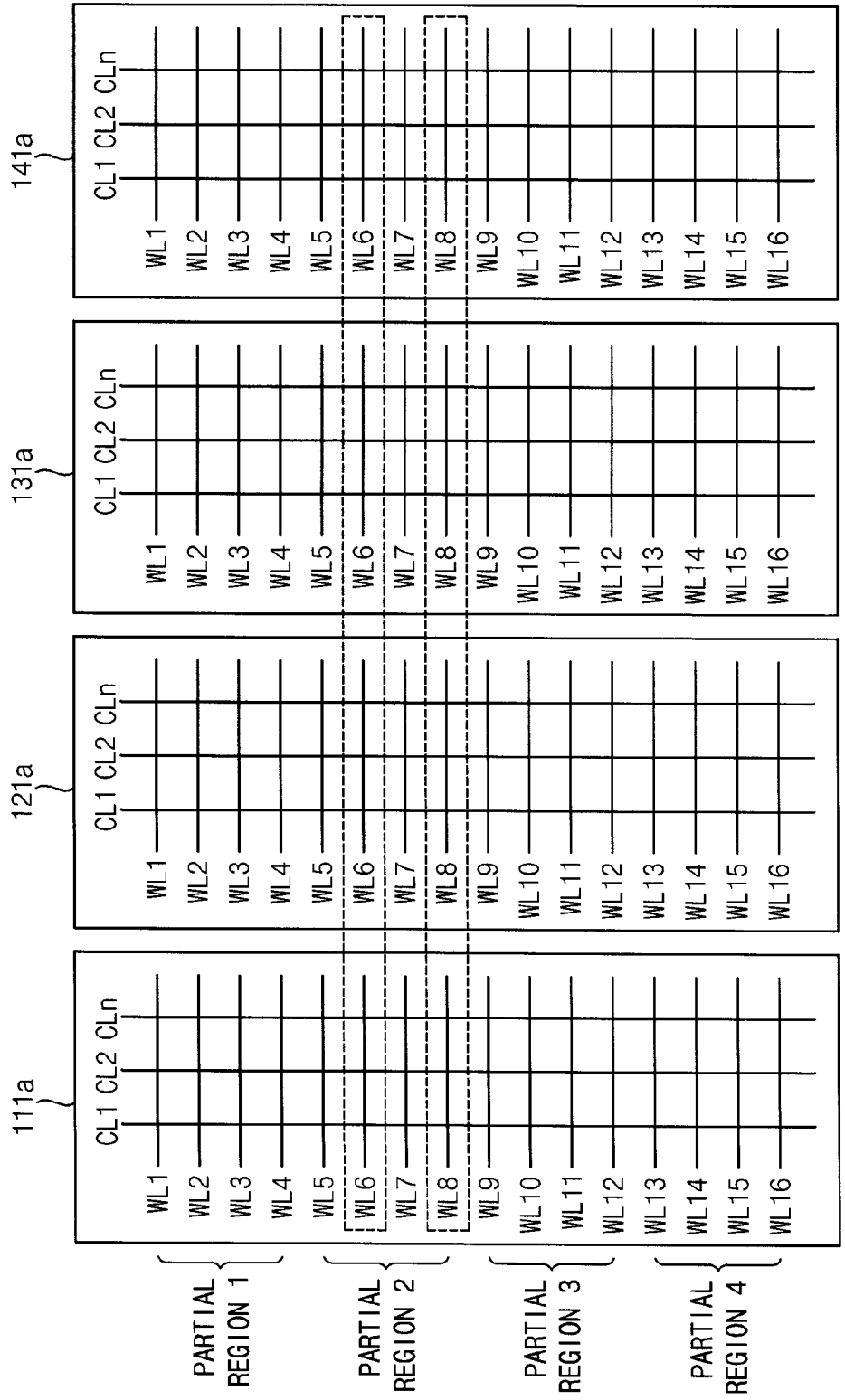
FIG. 16 is a diagram illustrating another example where the memory devices included in the memory module of FIG. 1 are refreshed.
Figure 17:
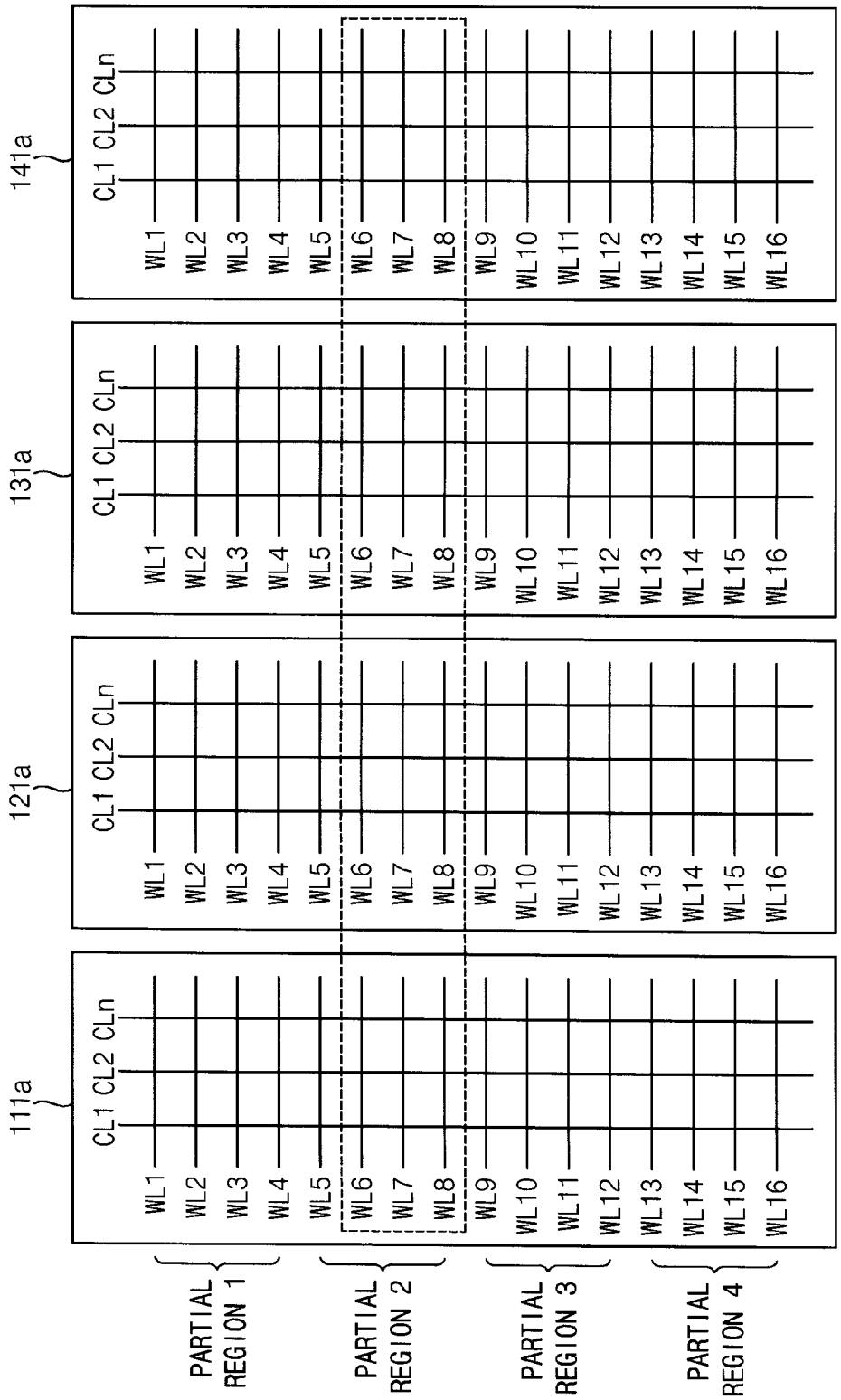
FIG. 17 is a diagram illustrating still another example where the memory devices included in the memory module of FIG. 1 are refreshed.

FIG. 15 is a diagram illustrating an example where memory devices included in the memory module of FIG. 1 are refreshed, FIG. 16 is a diagram illustrating another example where the memory devices 100a included in the memory module of FIG. 1 are refreshed and FIG. 17 is a diagram illustrating still another example where the memory devices included in the memory module of FIG. 1 are refreshed.

Referring to FIG. 15, the first through fourth memory devices 100a may receive the target row address TR_ADDR and the active signal ACT and refresh memory cells of the target row address TR_ADDR. For example, when the row address access number RAAN corresponding to a seventh row address WL7 (hereinafter, i-th row address WLi may referred to as an i-th row or i-th word line corresponding to a row address) included in the first memory cell array 111a is equal to or greater than the threshold value MAX_C, the max-count address generator MCAG that manages the second regions PARTIAL REGION 2 including the seventh row address WL7 may output the max-count address information MCAI. For example, the target row address TR_ADDR corresponding to the max-count address information MCAI may be the seventh row address WL7.

The plurality of memory devices 100a may receive the target row address TR_ADDR and the active signal ACT and refresh memory cells of the target row address TR_ADDR. For example, in case the target row address TR_ADDR is the seventh row address WL7, memory cells of the seventh row address WL7 included in the first memory cell array 111a, the seventh row address WL7 included in the second memory cell array 121a, the seventh row address WL7 included in the third memory cell array 131a and the seventh row address WL7 included in the fourth memory cell array 141a may be refreshed together.

Referring to FIG. 16, in one embodiment, the first through fourth memory devices 100a may receive the target row address TR_ADDR and the active signal ACT and refresh memory cells of a row address corresponding to the target row address TR_ADDR. For example, when the row address access number RAAN corresponding to a seventh row address WL7 included in the first memory cell array 111a is equal to or greater than the threshold value MAX_C, the max-count address generator MCAG outputs the max-count address information MCAI corresponding to the seventh row address WL7. When the buffer unit 300a receives the max-count address information MCAI corresponding to the seventh row address WL7 may output the target row address TR_ADDR. In one embodiment, when a number of accesses to the seventh row address WL7 reaches to the threshold value MAX_C, the buffer unit 300a may output the seventh row address WL7 as the target row address TR_ADDR. When the target row address TR_ADDR is the seventh row address WL7, an adjacent row address (e.g., an adjacent row) to the target row address TR_ADDR may be a sixth row address WL6. For example, memory cells of the sixth row address WL6 included in the first memory cell array 111a, the sixth row address WL6 included in the second memory cell array 121a, the sixth row address WL6 included in the third memory cell array 131a and the sixth row address WL6 included in the fourth memory cell array 141a may be refreshed together. When the target row address TR_ADDR is the seventh row address WL7, an adjacent row address to the target row address TR_ADDR may be an eighth row address WL8. For example, memory cells of the eighth row address WL8 included in the first memory cell array 111a, the eighth row address WL8 included in the second memory cell array 121a, the eighth row address WL8 included in the third memory cell array 131a and the eighth row address WL8 included in the fourth memory cell array 141a may be refreshed together. In another embodiment, the first through fourth memory devices 100a may receive the target row address TR_ADDR and the active signal ACT and refresh memory cells of the target row address TR_ADDR. When the row address access number RAAN corresponding to a seventh row address WL7 included in the first memory cell array 111a is equal to or greater than the threshold value MAX_C, the max-count address generator MCAG outputs the max-count address information MCAI corresponding to the seventh row address WL7. When the buffer unit 300a receives the max-count address information MCAI corresponding to the seventh row address WL7, the buffer unit 300a may output the sixth and eighth row addresses WL6 and WL8 as the target row address TR_ADDR. For example, the sixth row address WL6 and eighth row address WL8 are the adjacent row addresses to the seventh row address WL7.

Referring to FIG. 17, in one embodiment, the first through fourth memory devices 100a may receive the target row address TR_ADDR and the active signal ACT and refresh memory cells of the target row address TR_ADDR and an adjacent row address to the target row address TR_ADDR.

For example, when the target row address TR_ADDR is the seventh row address WL7, adjacent row addresses to the target row address TR_ADDR may be the sixth row address WL6 and the eighth row address WL8. For example, memory cells of the sixth through eighth row addresses included in the first memory cell array 111a, the sixth through eighth row addresses included in the second memory cell array 121a, the sixth through eighth row addresses included in the third memory cell array 131a and the sixth through eighth row addresses included in the fourth memory cell array 141a may be refreshed together. In another embodiment, the first through fourth memory devices 100a may receive the target row address TR_ADDR and the active signal ACT and refresh memory cells of the target row address TR_ADDR. When the row address access number RAAN corresponding to a seventh row address WL7 included in the first memory cell array 111a is equal to or greater than the threshold value MAX_C, the max-count address generator MCAG outputs the max-count address information MCAI corresponding to the seventh row address WL7. When the buffer unit 300a receives the max-count address information MCAI corresponding to the seventh row address WL7, the buffer unit 300a may output the sixth through eighth row addresses WL6, WL7, and WL8 as the target row address TR_ADDR. For example, the sixth row address WL6 and eighth row address WL8 are the adjacent row addresses to the seventh row address WL7.

Figure 18:
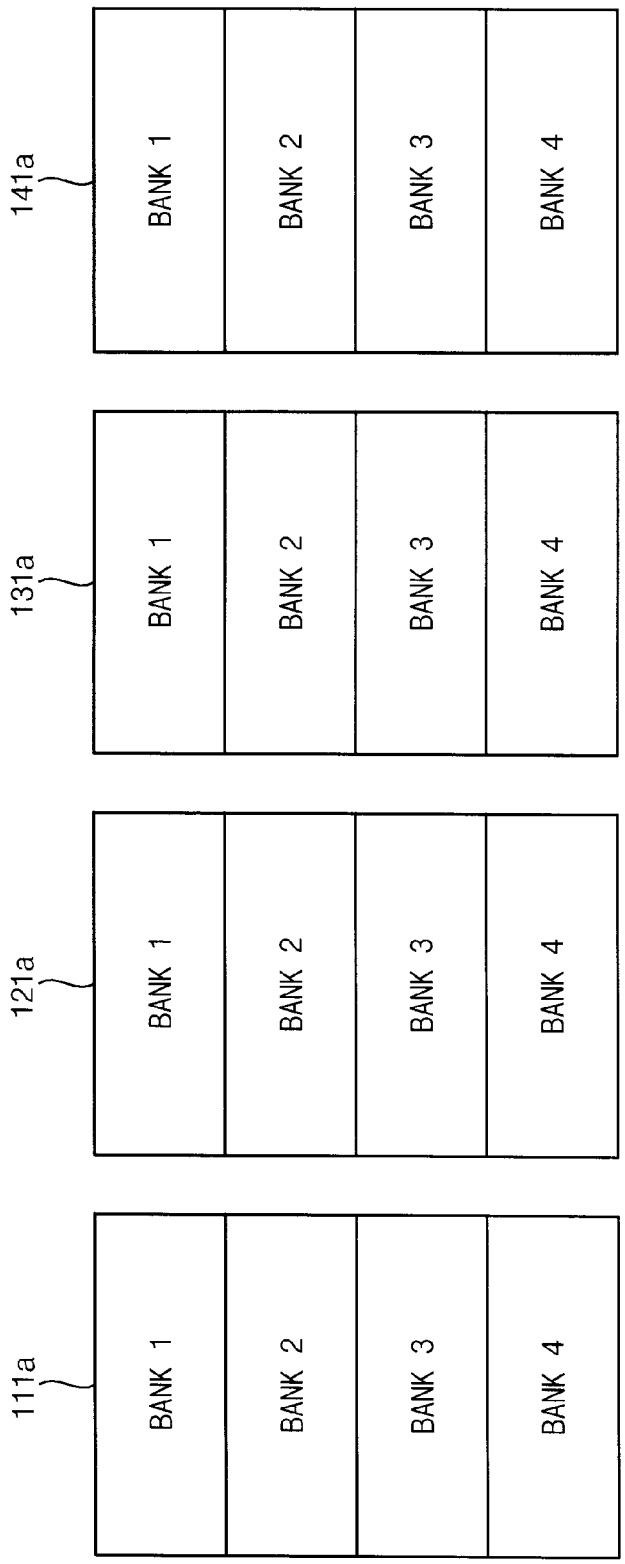
FIG. 18 is a diagram illustrating an example of regions included in a memory cell array of FIG. 1 according to one embodiment.

FIG. 18 is a diagram illustrating an example of regions included in a memory cell array of FIG. 1 according to one embodiment.

Referring to FIGS. 2 and 18, the first through fourth partial regions are first through fourth banks included in memory cell arrays of the first through fourth memory devices 100a. For example, the first region PARTIAL REGION 1 included in the first memory cell array 111a may be a first bank BANK 1 included in the first memory cell array 111a. The second region PARTIAL REGION 2 included in the first memory cell array 111a may be a second bank BANK 2 included in the first memory cell array 111a. The third region PARTIAL REGION 3 included in the first memory cell array 111a may be a third bank BANK 3 included in the first memory cell array 111a. The fourth region PARTIAL REGION 4 included in the first memory cell array 111a may be a fourth bank BANK 4 included in the first memory cell array 111a.

For example, the first region PARTIAL REGION 1 included in the first memory cell array 111a may be a first bank BANK 1 included in the first memory cell array 111a. The first region PARTIAL REGION 1 included in the second memory cell array 121a may be a first bank BANK 1 included in the second memory cell array 121a. The first region PARTIAL REGION 1 included in the third memory cell array 131a may be a first bank BANK 1 included in the third memory cell array 131a. The first region PARTIAL REGION 1 included in the fourth memory cell array 141a may be a first bank BANK 1 included in the fourth memory cell array 141a.

Figure 19:
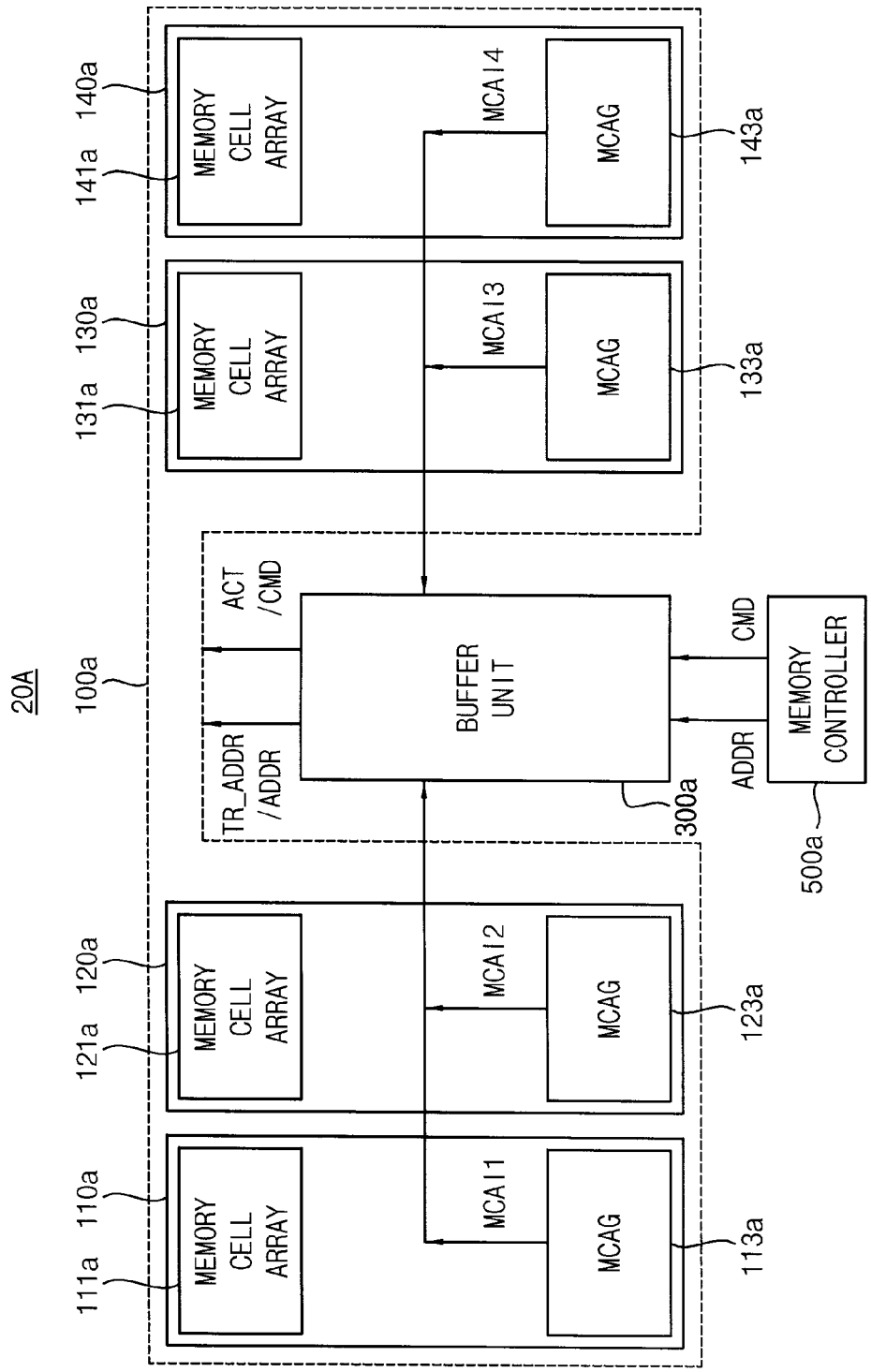
FIG. 19 is a block diagram illustrating a memory system according to example embodiments.

FIG. 19 is a block diagram illustrating a memory system according to example embodiments.

Referring to FIGS. 1, 2 and 19, a memory system 20A includes a memory module 10A and a memory controller 500a. The memory controller 500a provides an access address ADDR and a command CMD for the memory module 10A. For example, the memory module 10A includes first through fourth memory devices 100a and a buffer unit 300a. Each of the first through fourth memory devices 100a is divided into first through fourth regions. For example, the memory module 10A may include a first memory device 110a, a second memory device 120a, a third memory device 130a and a fourth memory device 140a. Each of the first memory device 110a, the second memory device 120a, the third memory device 130a and the fourth memory device 140a may include a memory cell array. For example, the memory cell array included in each of the first memory device 110a, the second memory device 120a, the third memory device 130a and the fourth memory device 140a may include a first region PARTIAL REGION 1, a second region PARTIAL REGION 2, a third region PARTIAL REGION 3 and a fourth region PARTIAL REGION 4.

Each of the first to fourth memory devices 100a may include a max-count address generator MCAG. For example, each of the first memory device 110a, the second memory device 120a, the third memory device 130a and the fourth memory device 140a may include the max-count address generator MCAG.

For example, the buffer unit 300a receives the max-count address information MCAI from the first through fourth memory devices 100a. For example, a first max-count address information MCAI 1 may be transferred from a first max-count address generator 113a included in the first memory device 110a to the buffer unit 300a. A second max-count address information MCAI 2 may be transferred from a second max-count address generator 123a included in the second memory device 120a to the buffer unit 300a. A third max-count address information MCAI 3 may be transferred from a third max-count address generator 133a included in the third memory device 130a to the buffer unit 300a. A fourth max-count address information MCAI 4 may be transferred from a fourth max-count address generator 143a included in the fourth memory device 140a to the buffer unit 300a.

In one embodiment, the buffer unit 300a may output an active signal ACT and a target row address TR_ADDR to refresh memory cells of a row address corresponding to the target row address TR_ADDR of the first to fourth memory devices 100a corresponding to the max-count address information MCAI.

For example, the max-count address generator MCAG included in each memory device of the first through fourth memory devices 100a outputs a max-count address information MCAI based on a row address access number RAAN. The row address access number RAAN may be a number of accesses to a row address included in a particular region of each of the first to fourth memory devices 100a. For example, the max-count address generator MCAG included in each memory device of the first through fourth memory devices 100a may count the row address access number RAAN of row addresses included in the first region PARTIAL REGION 1 of the first memory cell array 111a, the first region PARTIAL REGION 1 of the second memory cell array 121a, the first region PARTIAL REGION 1 of the third memory cell array 131a and the first region PARTIAL REGION 1 of the fourth memory cell array 141a. The max-count address generator MCAG included in each memory device may output the max-count address information MCAI based on the row address access number RAAN.

For example, row addresses of the first region PARTIAL REGION 1 included in the first memory cell array 111a may be 0x00000~0x00111. Row addresses of the first region PARTIAL REGION 1 included in the second memory cell array 121a may be 0x00000~0x00111. Row addresses of the first region PARTIAL REGION 1 included in the third memory cell array 131a may be 0x00000~0x00111. Row addresses of the first region PARTIAL REGION 1 included in the fourth memory cell array 141a may be 0x00000~0x00111. The row addresses included in the first region PARTIAL REGION 1 of the plurality of the memory devices 100a that the max-count address generator MCAG included in the K-th memory device manages may be the same as 0x00000~0x00111.

The max-count address generator MCAG according to example embodiments may decrease the complexity of the logic circuit included in the max-count address generator MCAG because the max-count address generator MCAG manages the row addresses of the same region included in each of the plurality of the memory devices 100a.

Referring to FIGS. 3 and 19, a conventional max-count address generator MCAG may count the row address access number RAAN of row addresses included in the first region PARTIAL REGION 1 of the first memory cell array 111a, the second region PARTIAL REGION 2 of the first memory cell array 111a, the third region PARTIAL REGION 3 of the first memory cell array 111a and the fourth region PARTIAL REGION 4 of the first memory cell array 111a. The conventional max-count address generator MCAG may output the max-count address information MCAI based on the row address access number RAAN.

For example, row addresses of the first region PARTIAL REGION 1 included in the first memory cell array 111a may be 0x00000~0x00111. Row addresses of the second region PARTIAL REGION 2 included in the first memory cell array 111a may be 0x01000~0x01111. Row addresses of the third region PARTIAL REGION 3 included in the first memory cell array 111a may be 0x10000~0x10111. Row addresses of the fourth region PARTIAL REGION 4 included in the first memory cell array 111a may be 0x11000~0x11111. The row addresses included in the first region PARTIAL REGION 1, the second region PARTIAL REGION 2, the third region PARTIAL REGION 3 and the fourth region PARTIAL REGION 4 of the first memory cell array 111a that the conventional max-count address generator MCAG manages may be the same as 0x00000~0x11111.

For example, in case the row address access number RAAN is counted by a row address included in the plurality of the memory devices, the complexity of the max-count address generator MCAG according to example embodiments may be ¼ of the complexity of the conventional max-count address generator MCAG.

Figure 20:
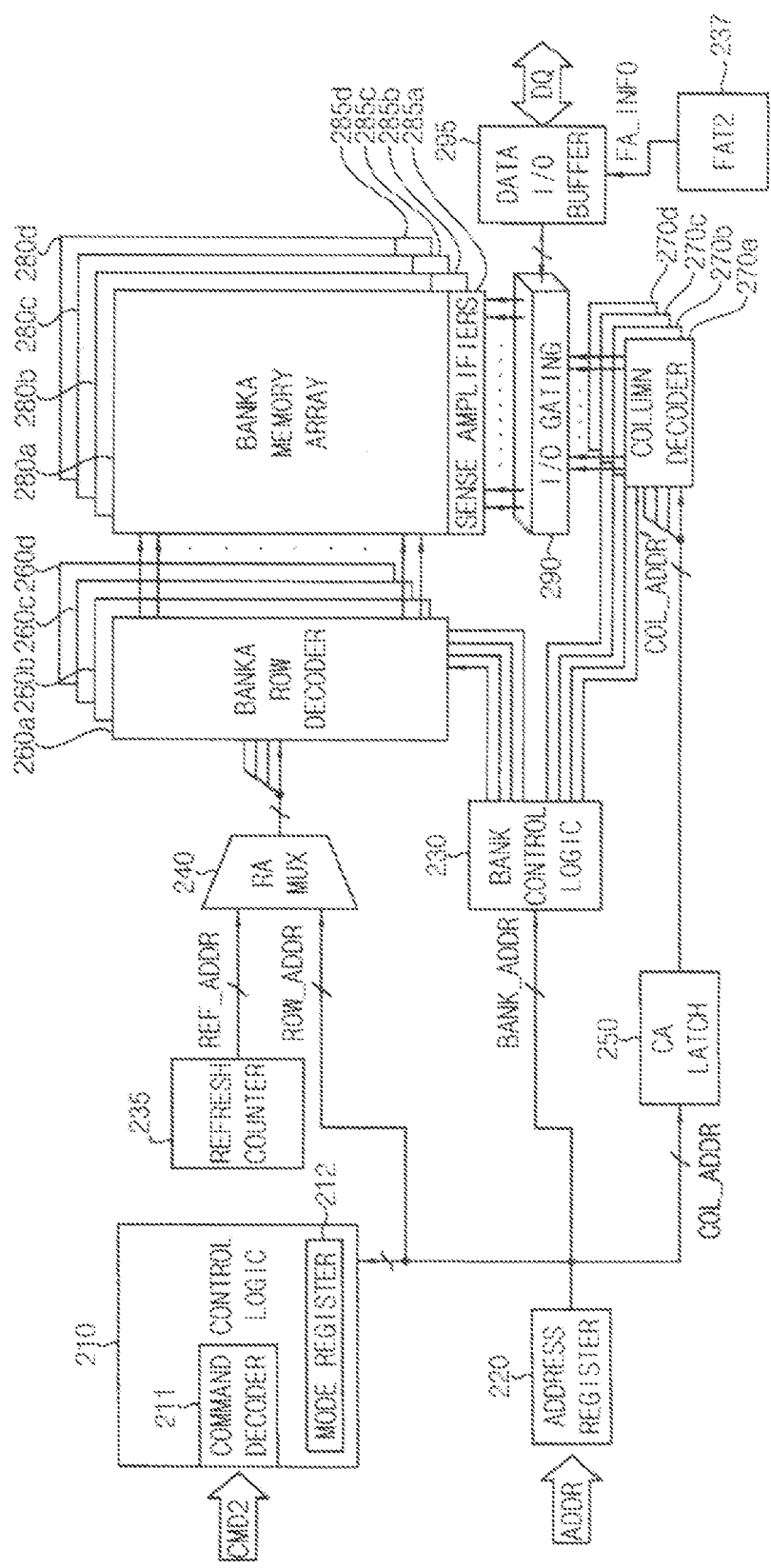
FIG. 20 is a block diagram illustrating an example of a memory device included in the memory module of FIG. 1 according to one embodiment.

FIG. 20 is a block diagram illustrating an example of a memory device included in the memory module of FIG. 1 according to one embodiment.

Referring to FIG. 20, the memory device 201 includes a control logic 210, an address register 220, a bank control logic 230, a row address multiplexer 240, a second fail address table 237, a refresh counter 235, a column address latch 250, a row decoder, a column decoder, a memory cell array, a sense amplifier unit, an input/output gating circuit 290 and a data input/output buffer 295. In some embodiments, the memory device 201 may be, for example, a dynamic random access memory (DRAM), such as a double data rate synchronous dynamic random access memory (DDR SDRAM), a low power double data rate synchronous dynamic random access memory (LPDDR SDRAM), a graphics double data rate synchronous dynamic random access memory (GDDR SDRAM), a rambus dynamic random access memory (RDRAM), etc. The memory device 201 may be one of the memory devices 100a disclosed above.

The memory cell array may include first through fourth bank arrays 280a, 280b, 280c and 280d. The row decoder may include first through fourth bank row decoders 260a, 260b, 260c and 260d respectively coupled to the first through fourth bank arrays 280a, 280b, 280c and 280d, the column decoder may include first through fourth bank column decoders 270a, 270b, 270c and 270d respectively coupled to the first through fourth bank arrays 280a, 280b, 280c and 280d, and the sense amplifier unit may include first through fourth bank sense amplifiers 285a, 285b, 285c and 285d respectively coupled to the first through fourth bank arrays 280a, 280b, 280c and 280d. The first through fourth bank arrays 280a, 280b, 280c and 280d, the first through fourth bank row decoders 260a, 260b, 260c and 260d, the first through fourth bank column decoders 270a, 270b, 270c and 270d and the first through fourth bank sense amplifiers 285a, 285b, 285c and 285d may form first through fourth banks. Although the volatile memory device 201 is illustrated in FIG. 20 as including four banks, the volatile memory device 201 may include any number of banks.

The address register 220 may receive an address ADDR including a bank address BANK_ADDR, a row address ROW_ADDR and a column address COL_ADDR from a memory controller or a buffer unit (not illustrated). The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. One of the first through fourth bank row decoders 260a, 260b, 260c and 260d corresponding to the bank address BANK_ADDR may be activated in response to the bank control signals, and one of the first through fourth bank column decoders 270a, 270b, 270c and 270d corresponding to the bank address BANK_ADDR may be activated in response to the bank control signals.

The row address multiplexer 240 may receive the row address ROW_ADDR from the address register 220, and may receive a refresh row address REF_ADDR from the refresh counter 235. The row address multiplexer 240 may selectively output the row address ROW_ADDR or the refresh row address REF_ADDR. A row address output from the row address multiplexer 240 may be applied to the first through fourth bank row decoders 260a, 260b, 260c and 260d.

The activated one of the first through fourth bank row decoders 260a, 260b, 260c and 260d may decode the row address output from the row address multiplexer 240, and may activate a word line corresponding to the row address. For example, the activated bank row decoder may apply a word line driving voltage to the word line corresponding to the row address.

The column address latch 250 may receive the column address COL_ADDR from the address register 220, and may temporarily store the received column address COL_ADDR. In some embodiments, in a burst mode, the column address latch 250 may generate column addresses that increment from the received column address COL_ADDR. The column address latch 250 may apply the temporarily stored or generated column address COL_ADDR' to the first through fourth bank column decoders 270a, 270b, 270c and 270d.

The activated one of the first through fourth bank column decoders 270a, 270b, 270c and 270d may decode the column address COL_ADDR' output from the column address latch 250, and may control the input/output gating circuit 290 to output data corresponding to the column address COL_ADDR'.

The input/output gating circuit 290 may include circuitry for gating input/output data. The input/output gating circuit 290 may further include an input data mask logic, read data latches for storing data output from the first through fourth bank arrays 280a, 280b, 280c and 280d, and write drivers for writing data to the first through fourth bank arrays 280a, 280b, 280c and 280d.

Data DQ to be read from one bank array of the first through fourth bank arrays 280a, 280b, 280c and 280d may be sensed by a sense amplifier coupled to the one bank array, and may be stored in the read data latches. The data DQ stored in the read data latches may be provided to the memory controller or the buffer unit via the data input/output buffer 295. Data DQ to be written to one bank array of the first through fourth bank arrays 280a, 280b, 280c and 280d may be provide from the memory controller or the buffer unit to the data input/output buffer 295. The data DQ provided to the data input/output buffer 295 may be written to the one array bank via the write drivers.

The control logic 210 may control operations of the memory device 200a. For example, the control logic 210 may generate control signals for the memory device 200a to perform a write operation or a read operation. The control logic 210 may include a command decoder 211 that decodes a command CMD received from the memory controller or the buffer unit and a mode register 212 that sets an operation mode of the memory device 201. For example, the command decoder 211 may generate the control signals corresponding to the command CMD by decoding a write enable signal (/WE), a row address strobe signal (/RAS), a column address strobe signal (/CAS), a chip select signal (/CS), etc. The command decoder 211 may further receive a clock signal (CLK) and a clock enable signal (/CKE) for operating the memory device 201 in a synchronous manner.

Figure 21:
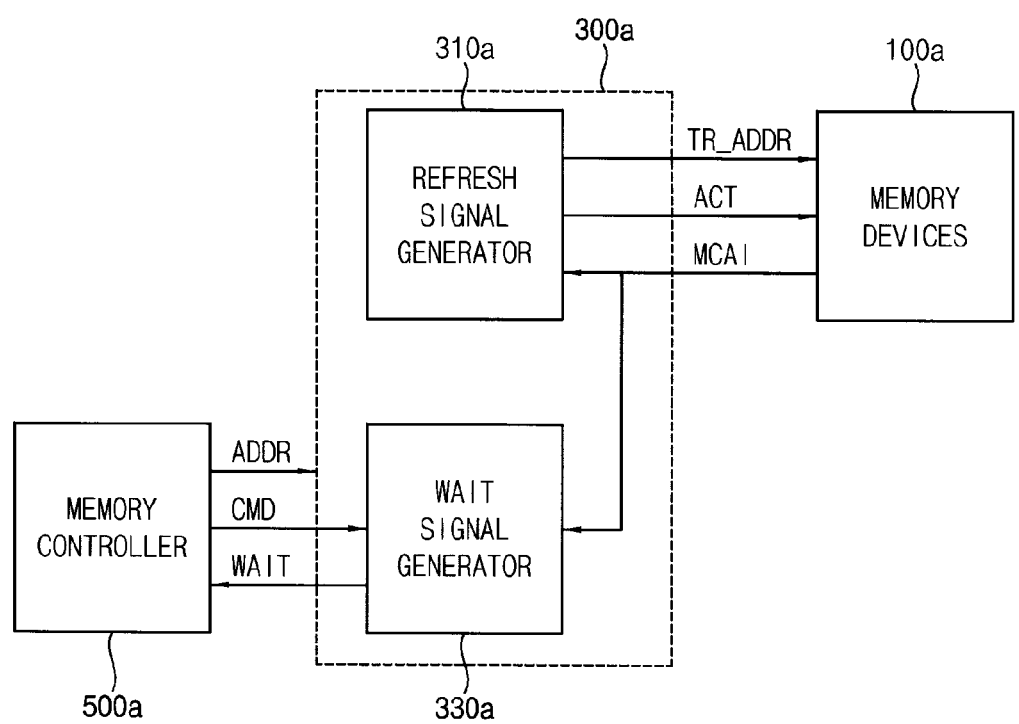
FIG. 21 is a diagram for describing an example of the buffer unit included in the memory system of FIG. 19 according to one embodiment.

FIG. 21 is a diagram for describing an example of the buffer unit included in the memory system of FIG. 19 according to one embodiment.

Referring to FIG. 21, the buffer unit 300a may include a refresh signal generator 310a and a wait signal generator 330a. The refresh signal generator 310a may provide the target row address TR_ADDR and the active signal ACT for the first through fourth memory devices 100a based on the max-count address information MCAI. For example, the active signal ACT may include a precharge command signal so that memory cells of the target row address TR_ADDR or a row address corresponding to the target row address TR_ADDR are refreshed in response to the max-count address information MCAI. Also, the refresh signal generator 310a may output a refresh command signal to the memory devices 100a to perform a refresh operation for the memory cells. The wait signal generator 330a may provide a wait signal WAIT for the memory controller 500a in case the buffer unit 300a simultaneously receives the command CMD from the controller and the max-count address information MCAI from the memory devices 100a. For example, when the wait signal generator 330a simultaneously receives the max-count address information MCAI and a read command, the wait signal generator 330a may provide the wait signal WAIT to the memory controller 500a to perform the refresh operation according to the max-count address information MCAI.

In case the memory controller 500a receives the wait signal WAIT, the memory controller 500a may stop providing a command CMD to the buffer unit 300a. For example, in case the memory controller 500a receives the wait signal WAIT, the memory controller 500a may stop providing a read command or a write command.

In case the memory controller 500a receives the wait signal WAIT, the memory controller 500a may retry a command CMD after a predetermined time interval. For example, in case the memory controller 500a receives the wait signal WAIT, the memory controller 500a may provide the read command or the write command after the predetermined time interval.

Figure 22:
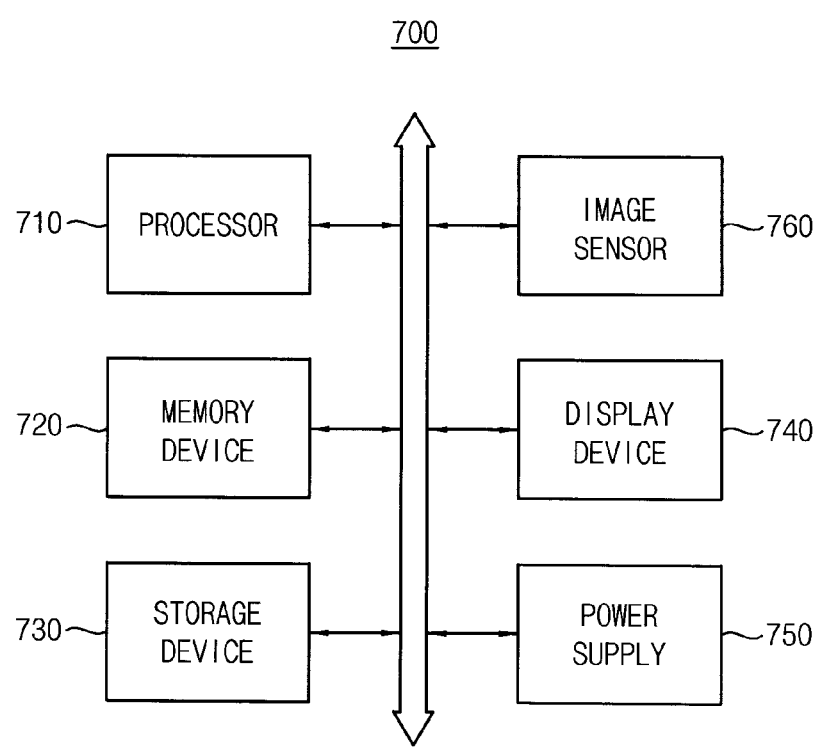
FIG. 22 is a block diagram illustrating a mobile device including the memory module according to example embodiments.

FIG. 22 is a block diagram illustrating a mobile device including the memory module according to example embodiments.

Referring to FIG. 22, a computing system 700 may include a processor 710, a memory device 720, a storage device 730, a display device 740, a power supply 750 and an image sensor 760. The computing system 700 may further include ports that communicate with a video card, a sound card, a memory card, a USB device, other electronic devices, etc. The memory device 720 may include the memory devices 100a and/or the buffer unit 300a disclosed above.

The processor 710 may perform various calculations or tasks. According to embodiments, the processor 710 may be a microprocessor or a CPU. The processor 710 may communicate with the memory device 720, the storage device 730, and the display device 740 via an address bus, a control bus, and/or a data bus. In some embodiments, the processor 710 may be coupled to an extended bus, such as a peripheral component interconnection (PCI) bus. The memory device 720 may store data for operating the computing system 700. For example, the memory device 720 may be implemented with, for example, a dynamic random access memory (DRAM) device, a mobile DRAM device, a static random access memory (SRAM) device, a phase-change random access memory (PRAM) device, a ferroelectric random access memory (FRAM) device, a resistive random access memory (RRAM) device, and/or a magnetic random access memory (MRAM) device. The memory device 720 may include the data loading circuit according to example embodiments. The storage device 730 may include, for example, a solid state drive (SSD), a hard disk drive (HDD), a CD-ROM, etc. The computing system 700 may further include an input device such as a touchscreen, a keyboard, a keypad, a mouse, etc., and an output device such as a printer, a display device, etc. The power supply 750 supplies operation voltages for the computing system 700.

The image sensor 760 may communicate with the processor 710 via the buses or other communication links. The image sensor 760 may be integrated with the processor 710 in one chip, or the image sensor 760 and the processor 710 may be implemented as separate chips.

At least a portion of the computing system 700 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP). The computing system 700 may be a digital camera, a mobile phone, a smart phone, a portable multimedia player (PMP), a personal digital assistant (PDA), a computer, etc.

Figure 23:
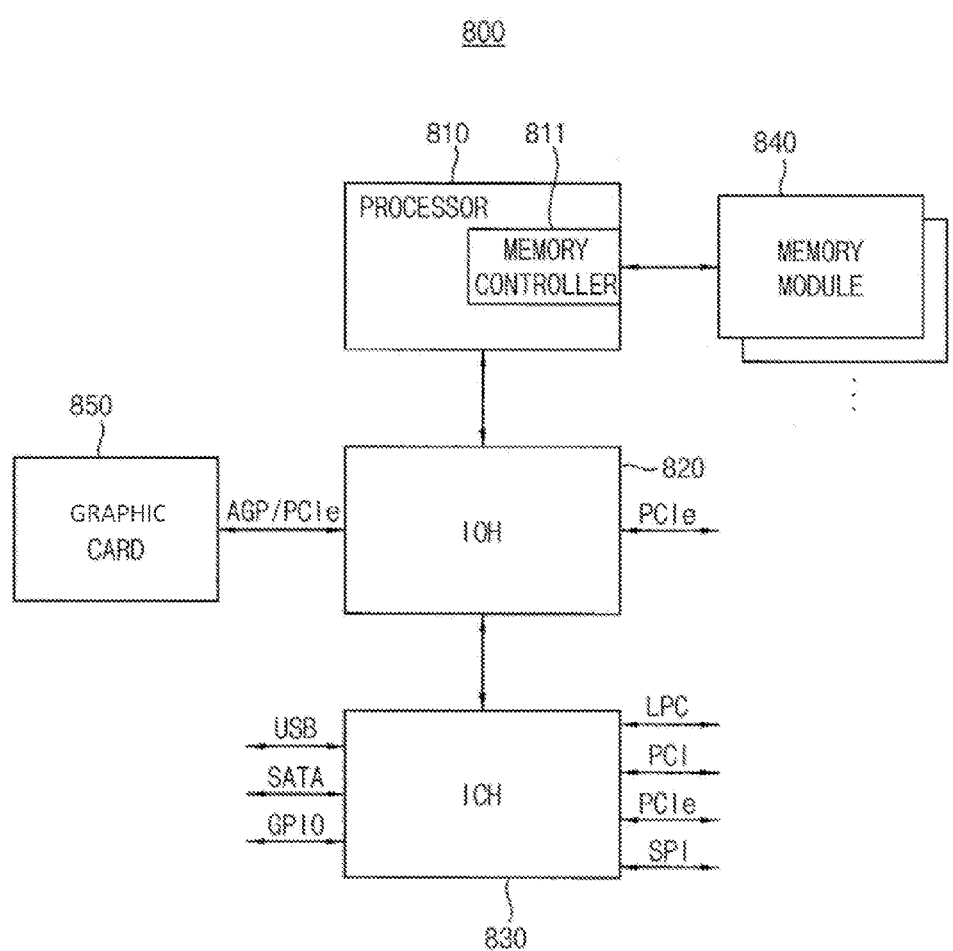
FIG. 23 is a block diagram illustrating a computing system including the memory module according to example embodiments.

FIG. 23 is a block diagram illustrating a computing system including the memory module according to example embodiments.

Referring to FIG. 23, a computing system 800 includes a processor 810, an input/output hub (IOH) 820, an input/output controller hub (ICH) 830, at least one memory module 840 and a graphics card 850. In some embodiments, the computing system 800 may be a personal computer (PC), a server computer, a workstation, a laptop computer, a mobile phone, a smart phone, a personal digital assistant (PDA), a portable multimedia player (PMP), a digital camera), a digital television, a set-top box, a music player, a portable game console, a navigation system, etc. The memory module 840 may include a structure of 10A of FIG. 1 or 10B of FIG. 4 disclosed above.

The processor 810 may perform various computing functions, such as executing specific software for performing specific calculations or tasks. For example, the processor 810 may be a microprocessor, a central process unit (CPU), a digital signal processor, or the like. In some embodiments, the processor 810 may include a single core or multiple cores. For example, the processor 810 may be a multi-core processor, such as a dual-core processor, a quad-core processor, a hexa-core processor, etc. Although FIG. 21 illustrates the computing system 800 including one processor 810, in some embodiments, the computing system 800 may include a plurality of processors. The processor 810 may include an internal or external cache memory.

The processor 810 may include a memory controller 811 for controlling operations of the memory module 840. The memory controller 811 included in the processor 810 may be referred to as an integrated memory controller (IMC). A memory interface between the memory controller 811 and the memory module 840 may be implemented with a single channel including a plurality of signal lines, or may bay be implemented with multiple channels, to each of which at least one memory module 840 may be coupled. In some embodiments, the memory controller 811 may be located inside the input/output hub 820, which may be referred to as memory controller hub (MCH).

The memory module 840 may include a plurality of memory devices that store data provided from the memory controller 811 and a buffer chip that manages overall operation of the memory devices. Each of the memory devices may store data processed by the CPU 710, or may operate as a working memory. Each of the memory devices may be a dynamic random access memory, such as DDR SDRAM, LPDDR SDRAM, GDDR SDRAM, RDRAM, etc. The buffer chip manages operation of the memory devices.

The input/output hub 820 may manage data transfer between processor 810 and devices, such as the graphics card 850. The input/output hub 820 may be coupled to the processor 810 via various interfaces. For example, the interface between the processor 810 and the input/output hub 820 may be a front side bus (FSB), a system bus, a HyperTransport, a lightning data transport (LDT), a QuickPath interconnect (QPI), a common system interface (CSI), etc. Although FIG. 21 illustrates the computing system 800 including one input/output hub 820, in some embodiments, the computing system 800 may include a plurality of input/output hubs. The input/output hub 820 may provide various interfaces with the devices. For example, the input/output hub 820 may provide an accelerated graphics port (AGP) interface, a peripheral component interface-express (PCIe), a communications streaming architecture (CSA) interface, etc.

The graphics card 850 may be coupled to the input/output hub 820 via AGP or PCIe. The graphics card 850 may control a display device (not illustrated) for displaying an image. The graphics card 850 may include an internal processor for processing image data and an internal memory device. In some embodiments, the input/output hub 820 may include an internal graphics device along with or instead of the graphics card 850 outside the graphics card 850. The graphics device included in the input/output hub 820 may be referred to as integrated graphics. Further, the input/output hub 820 including the internal memory controller and the internal graphics device may be referred to as a graphics and memory controller hub (GMCH).

The input/output controller hub 830 may perform data buffering and interface arbitration to efficiently operate various system interfaces. The input/output controller hub 830 may be coupled to the input/output hub 820 via an internal bus, such as a direct media interface (DMI), a hub interface, an enterprise Southbridge interface (ESI), PCIe, etc. The input/output controller hub 830 may provide various interfaces with peripheral devices. For example, the input/output controller hub 830 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some embodiments, the processor 810, the input/output hub 820 and the input/output controller hub 830 may be implemented as separate chipsets or separate integrated circuits. In other embodiments, at least two of the processor 810, the input/output hub 820 and the input/output controller hub 830 may be implemented as a single chipset.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of exemplary embodiments of the inventive concepts. Accordingly, all such modifications are intended to be included within the scope of the inventive concepts as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A memory module comprising:
   first through N-th memory devices, each of the first through N-th memory devices being divided into first through M-th regions, each of the first through N-th memory devices including a max-count address generator,
   wherein for each of the max-count address generators, the max-count address generator is configured to count a number of accesses to a row address included in respective J-th regions of the first through N-th memory devices and is configured to output a max-count address information when the number of the counted accesses reaches a threshold value, where M and N are integers equal to or greater than 2, and J is a natural number equal to or less than M; and
   a buffer unit configured to receive the max-count address information from the first through N-th memory devices and configured to output a target row address to refresh memory cells of the target row address of the first to N-th memory devices corresponding to the max-count address information,
   wherein each of the max-count address generators is configured to count a number of accesses for a set of row addresses different from the sets of row addresses for which the other max-count address generators count accesses.

2. The memory module of claim 1,
   wherein the max-count address generator includes:
   a counter circuit configured to count a number of accesses for each row address of the respective J-th regions included in the first through N-th memory devices;
   a storage circuit configured to store the number of the counted accesses; and a comparing circuit configured to output the max-count address information by comparing the number of the counted accesses to a threshold value.

3. The memory module of claim 2, wherein, when the number of the counted accesses to a particular row address in one of the J-th regions is equal to or greater than the threshold value, the comparing circuit outputs the max-count address information to the buffer unit.

4. The memory module of claim 3,
wherein the threshold value is determined based on a predetermined time interval, and
wherein, when the predetermined time interval is decreased, the threshold value is decreased.

5. The memory module of claim 4,
wherein the storage circuit is configured to store the number of accesses to row addresses included in the J-th regions.

6. The memory module of claim 2,
wherein each of the counters counts a number of accesses to a particular row address corresponding to the J-th regions for each of the first through N-th memory devices.

7. The memory module of claim 1, wherein the buffer unit includes a refresh signal generator configured to output the target row address to the first through N-th memory devices based on the max-count address information.

8. The memory module of claim 7, wherein, when at least one max-count address generator of the max-count address generators included in the first through N-th memory devices outputs the max-count address information, the refresh signal generator outputs the target row address corresponding to the max-count address information.

9. The memory module of claim 1, wherein when the first through N-th memory devices receive the target row address, memory cells of an adjacent row address to the target row address are refreshed.

10. The memory module of claim 1, wherein when the first through N-th memory devices receive the target row address, memory cells of the target row address and an adjacent row address to the target row address are refreshed.

11. The memory module of claim 1, wherein each of the J-th regions is a bank included in a memory cell array of a respective one of the first through N-th memory devices.

12. A memory system comprising:
a memory module; and
a memory controller configured to output an address and a command to the memory module,
wherein the memory module includes:
first through N-th memory devices, each of the first through N-th memory devices being divided into first through M-th regions, each of the first through N-th memory devices including a max-count address generator,
wherein for each of the max-count address generators, the max-count address generator is configured to count a number of accesses to a row address included in respective J-th regions of the first through N-th memory devices and is configured to output a max-count address information when the number of the counted accesses reaches a threshold value, where M and N are integers equal to or greater than 2, and J is a natural number equal to or less than M; and
a buffer unit configured to receive the max-count address information from the first through N-th memory devices and configured to output a target row address to refresh memory cells of the target row address of the first to N-th memory devices corresponding to the max-count address information,
wherein each of the max-count address generators is configured to count a number of accesses for a set of row addresses different from the sets of row addresses for which the other max-count address generators count accesses.

13. The memory system of claim 12,
wherein the buffer unit includes:
a refresh signal generator configured to output the target row address to the first through N-th memory devices based on the max-count address information; and
a wait signal generator configured to output a wait signal to the memory controller when the buffer unit simultaneously receives the command from the memory controller and the max-count address information from at least one of the first through N-th memory devices.

14. The memory system of claim 13,
wherein the memory controller is configured to, when the memory controller receives the wait signal, stop the command to the memory module.

15. The memory system of claim 14,
wherein the memory controller is configured to, when the memory controller receives the wait signal, retry the command to the memory module after a predetermined time interval.

16. A memory module comprising:
m memory devices, each of the m memory devices being divided into n regions each region including a plurality of rows corresponding to row addresses, where m and n are integers equal to or greater than 2; and
an address detector included in each of the m memory devices, wherein for each of the address detectors, the address detector is configured to count a number of accesses to a particular row address included in one region of each of the m memory devices during a predetermined time period, and is configured to output a detect signal when the number of the counted accesses reaches a reference value,
wherein each of the address detectors is configured to count a number of accesses for a set of row addresses different from the sets of row addresses for which the other address detectors count accesses.

17. The memory module of claim 16, further comprising:
a buffer unit configured to output a target row address to refresh memory cells of the target row address in response to the detect signal.

18. The memory module of claim 17, wherein a row of the target row address is located adjacent to a row of the particular row address.

19. The memory module of claim 17, wherein the buffer unit is further configured to output decoding signals to select an address detector of each of the m memory devices.

20. A memory system comprising:
the memory module of claim 17; and
a memory controller configured to output an address and a command to the memory module,
wherein the buffer unit is configured to output a wait signal to the memory controller when the buffer unit simultaneously receives the command from the memory controller and the detect signal from at least one of the m memory devices.

* * * * *